(12) United States Patent
Raad et al.

(10) Patent No.: US 11,404,111 B2
(45) Date of Patent: *Aug. 2, 2022

(54) SENSING TECHNIQUES USING A CHARGE TRANSFER DEVICE

(71) Applicant: Micron Technology, Inc., Boise, ID (US)

(72) Inventors: George B. Raad, Boise, ID (US); John F. Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/154,949

(22) Filed: Jan. 21, 2021

(65) Prior Publication Data

US 2021/0142844 A1 May 13, 2021

Related U.S. Application Data

(62) Division of application No. 16/232,280, filed on Dec. 26, 2018, now Pat. No. 10,923,180.

(51) Int. Cl.
| | |
|---|---|
| *G11C 7/00* | (2006.01) |
| *G11C 11/4091* | (2006.01) |
| *G11C 11/56* | (2006.01) |
| *G11C 11/408* | (2006.01) |
| *G11C 11/404* | (2006.01) |

(52) U.S. Cl.
CPC ........ *G11C 11/4091* (2013.01); *G11C 11/404* (2013.01); *G11C 11/4087* (2013.01); *G11C 11/56* (2013.01)

(58) Field of Classification Search
CPC .................................................. G11C 11/4091
USPC ........................................................... 365/205
See application file for complete search history.

(56) References Cited

U.S. PATENT DOCUMENTS

| | | | | |
|---|---|---|---|---|
| 5,999,438 A | * | 12/1999 | Ohsawa | ............... G11C 11/5657 365/145 |
| 10,832,769 B2 | * | 11/2020 | Raad | ..................... G11C 11/221 |

* cited by examiner

*Primary Examiner* — Hoai V Ho
(74) *Attorney, Agent, or Firm* — Holland & Hart LLP

(57) ABSTRACT

Techniques are provided for sensing a signal associated with a memory cell capable of storing three or more logic states. To sense the memory cell (e.g., a signal associated with the memory cell), a charge may be transferred between a digit line and a node coupled with a plurality of sense components using a charge transfer device. Once the charge is transferred, at least some if not each of the plurality of sense components may sense the charge using one of a variety of sensing schemes. For example, the charge may be sensed by each sense component at a same time using a single fixed reference value, or at different times using different fixed reference values. Based on the charge being transferred or transferred with the node (e.g., using the charge transfer device) and each sense component sensing the charge, a logic state associated with the memory cell may be determined.

20 Claims, 10 Drawing Sheets

SENSING TECHNIQUES USING A CHARGE TRANSFER DEVICE

CROSS REFERENCE

The present application for patent is a divisional of U.S. patent application Ser. No. 16/232,280, by Raad et al., entitled "SENSING TECHNIQUES USING A CHARGE TRANSFER DEVICE," filed Dec. 26, 2018, assigned to the assignee hereof, and is expressly incorporated by reference in its entirety herein.

BACKGROUND

The following relates generally to a system that includes at least one memory device and more specifically to sensing techniques using a charge transfer device.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Volatile memory devices, e.g., DRAM, may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Some memory cells may be configured to store multiple states. Sensing a signal associated with such a memory cell capable of storing multiple states may be desired to more accurately determine the logic state stored to the memory cell and increase reliability during a read operation, among other benefits.

DETAILED DESCRIPTION

Figure 1:
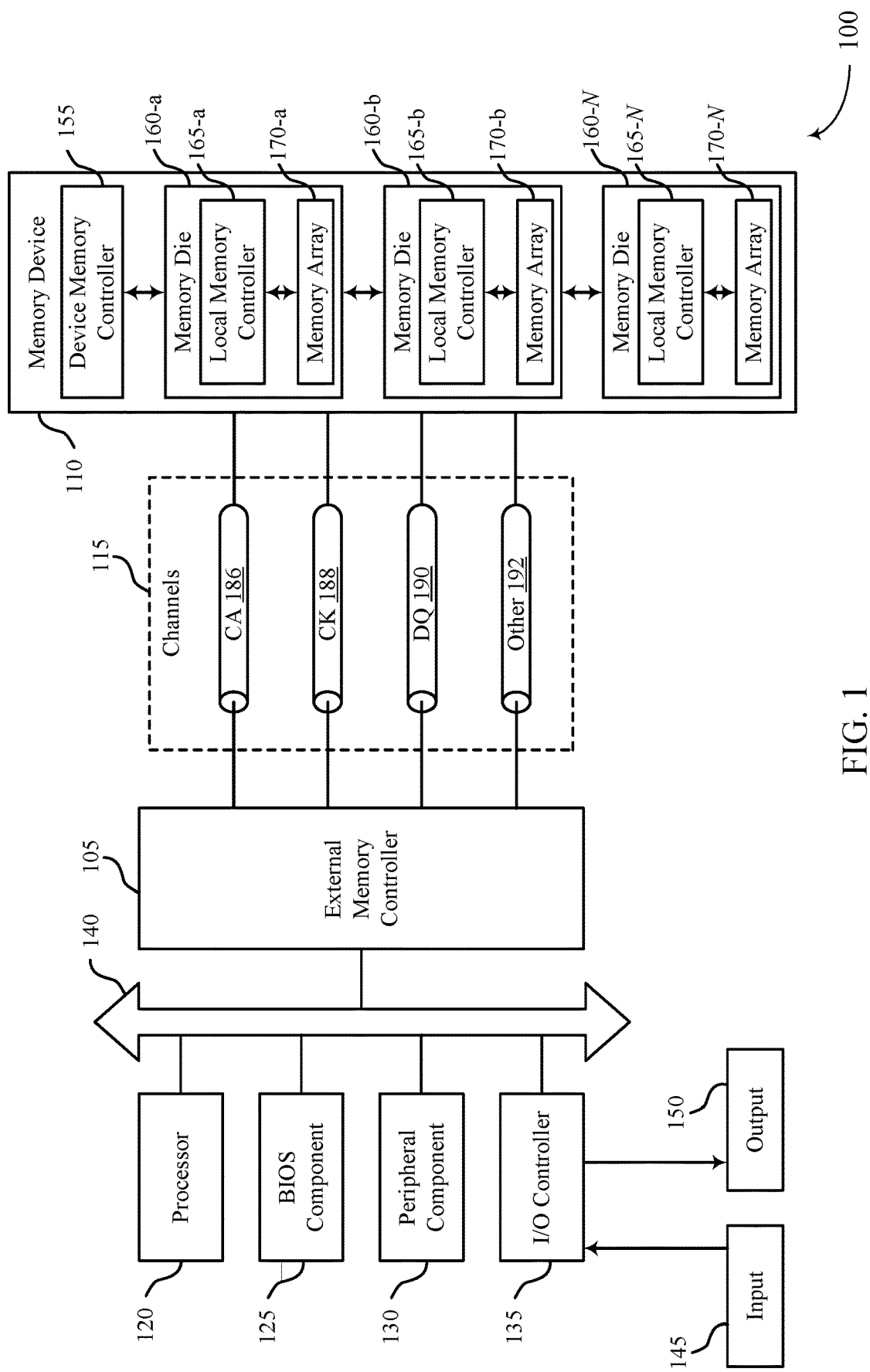
FIG. 1 illustrates an example of a system for transferring a charge between a digit line and a sense component that supports sensing techniques using a charge transfer device in accordance with aspects of the present disclosure.

A memory cell capable of storing three or more states (e.g., a multi-level memory cell) may be read (e.g., sensed) using a charge transfer device. As such, a single multi-level memory cell may be configured to store more than one bit of digital data. To sense a multi-level memory cell, a charge transfer device may be used to improve the window in which the memory cell is sensed. For example, the charge transfer device may augment differences between charges stored on a memory cell to more-accurately sense the particular logic state stored on the memory cell. Thus, based on the particular logic state stored to the memory cell, the charge transfer device may couple a digit line associated with the memory cell to one or more sense components during a read operation.

Techniques are provided for sensing a multi-level memory cell. In some examples, a multi-level memory cell may store multiple logic states, such as three logic states (e.g., logic 00, 01, 11) and, in other examples, a multi-level memory cell may store four or more logic states (e.g., logic 00, 01, 10, 11). To sense a logic state of the multi-level memory cell, a charge may be transferred between a digit line coupled with a multi-level memory cell and one or more sense components. A charge transfer device may be used to transfer the charge between the digit line and one or more sense components. The charge transfer device may be coupled with the digit line and the sense component, such that when a voltage of the digit line (e.g., due to the multi-level memory cell being discharged onto the digit line) is less than a voltage of a gate of the charge transfer device, the charge is transferred to a node coupled with the first sense component and the second sense component.

When sensing a multi-level memory cell configured to store three logic states, various sensing schemes may be used. In some examples, a signal associated with the memory cell may be sensed by each sense component at a different time using a single fixed reference voltage (e.g., a fixed reference value). In other examples, the signal associated with the memory cell may be sensed by each sense component at a same time using different fixed reference voltages (e.g., using a first reference value and a second reference value). In either example, a signal may be transferred to a node that is coupled with the first sense component and the second sense component (e.g., using the charge transfer device), and may be sensed (e.g., by each sense component). Accordingly, the logic state of the multi-level memory cell may be based in part on the sense operations conducted by the first sense component and the second sense component.

In other examples, techniques are provided for sensing a multi-level memory cell configured to store four logic states. As described above, a charge may be transferred between a digit line (e.g., a digit line of a multi-level memory cell) and one or more sense components based on a voltage the digit line and a voltage of the gate of the charge transfer device. When sensing the multi-level memory cell configured to store four or more logic states, various sensing schemes may be used. In some examples, a signal associated with the memory cell may be sensed by each sense component at a different time using a single fixed reference voltage (e.g., a fixed reference value). In other examples, the signal associated with the memory cell may be sensed by each sense component at a same time using different fixed reference voltages (e.g., using a first reference value and a second reference value). In either example, a signal may be transferred to a node that is coupled with the first sense component, the second sense component, and a third sense component (e.g., using the charge transfer device), and may be sensed by each sense component. Accordingly, the logic state of the multi-level memory cell may be based in part on the sense operations conducted by each of the three or more sense components.

Features of the disclosure are initially described in the context of a memory system. Features of the disclosure are described in the context of a memory die, a memory circuit, and timing diagrams that support sensing techniques using a charge transfer device in accordance with aspects of the present disclosure. These and other features of the disclosure are further illustrated by and described with reference to an apparatus diagram and flowcharts that relate to sensing techniques using a charge transfer device.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 125 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 125 may be other components understood by those skilled in the art as peripherals.

The I/O controller 135 may manage data communication between the processor 120 and the peripheral component(s) 13, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some examples, memory device 110 may be coupled with multiple sense components. Each memory cell, for example, may be coupled with the sense components via a digit line coupled with a charge transfer device (e.g., a transistor). The gate of the charge transfer device may be coupled with a compensation device (e.g., a second transistor) and a capacitor configured to compensate for a threshold voltage associated with the charge transfer device. In some examples, the charge transfer device may be configured to transfer a charge between the digit line and the sense component based on a memory cell being discharged onto the digit line. Subsequently, each sense component may sense a respective charge using a fixed reference voltage, multiple reference voltages, at a same time, at different times, or a combination thereof.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. As described above, the memory device 110 may be coupled with multiple sense components. For example, each memory cell (e.g., of a respective memory array) may be coupled with the sense components via digit line and a charge transfer device (e.g., a transistor). In some examples, the gate of each transistor may be coupled with a compensation device (e.g., a second transistor) and a capacitor configured to compensate for a threshold voltage associated with the charge transfer device.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120).

In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like. In some examples, the device memory controller 155 may be configured to control the operations of a memory array as it relates to a read operation using a charge transfer device. For example each memory cell of memory array 170-a may be coupled with a node of at least a first sense component and a second sense component via a respective digit line. In some examples, the digit line may be coupled with a charge transfer device configured to transfer a charge between the digit line and the node based on a memory cell being discharged onto the digit line.

In some examples, the memory cell may be sensed by the local memory controller 165 transferring, using a first transistor (e.g., using a charge transfer device), a charge between the digit line and the node. In some examples, the first sense component may sense a signal on the node at a first time based at least in part on transferring the charge between the digit line and the node. Additionally or alternatively, the second sense component may sense the signal on the node at a second time different than the first time based at least in part on transferring the charge between the digit line and the node. The local memory controller 165 may determine a logic state of the memory cell based at least in part on sensing the signal by the first sense component and sensing the signal by the second sense component. In some examples, each of the sense components may sense the respective signal using a fixed reference voltage or by using a different reference voltage.

In other examples, the memory cell may be sensed by the local memory controller 165 transferring a charge between the digit line and the node. The first sense component may sense a signal on the node at a time using a first reference value based at least in part on transferring the charge between the digit line and the node. Additionally or alternatively, the second sense component may sense the signal on the node at the time using a second reference value based at least in part on transferring the charge between the digit line and the node. The local memory controller 165 may then determine a logic state of the multi-level memory cell based at least in part on sensing the signal by the first sense component and sensing the signal by the second sense component. In some examples, each of the sense components may sense the respective signal using a fixed reference voltage or by using a different reference voltage. Additionally or alternatively, in the examples described above, the local memory controller 165 may implement at least a third sense component to determine the logic state of the memory cell.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. In some cases, the clock signal may be a 1.5 GHz signal. A CK channel 188 may include any number of signal paths. In some cases, the clock signal CK (e.g., a CK t signal and a CK c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK t signal and a WCK c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured coordinate an access operation (e.g., a write operation or read operation) of the external memory controller 105 and the memory device 110. In some cases, the write clock signal may be a differential output (e.g., a WCK t signal and a WCK c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols. As indicated herein and described with reference to FIGS. 3 through 5, the sensing scheme described may be performed with respect to multi-level memory cells.

Figure 2:
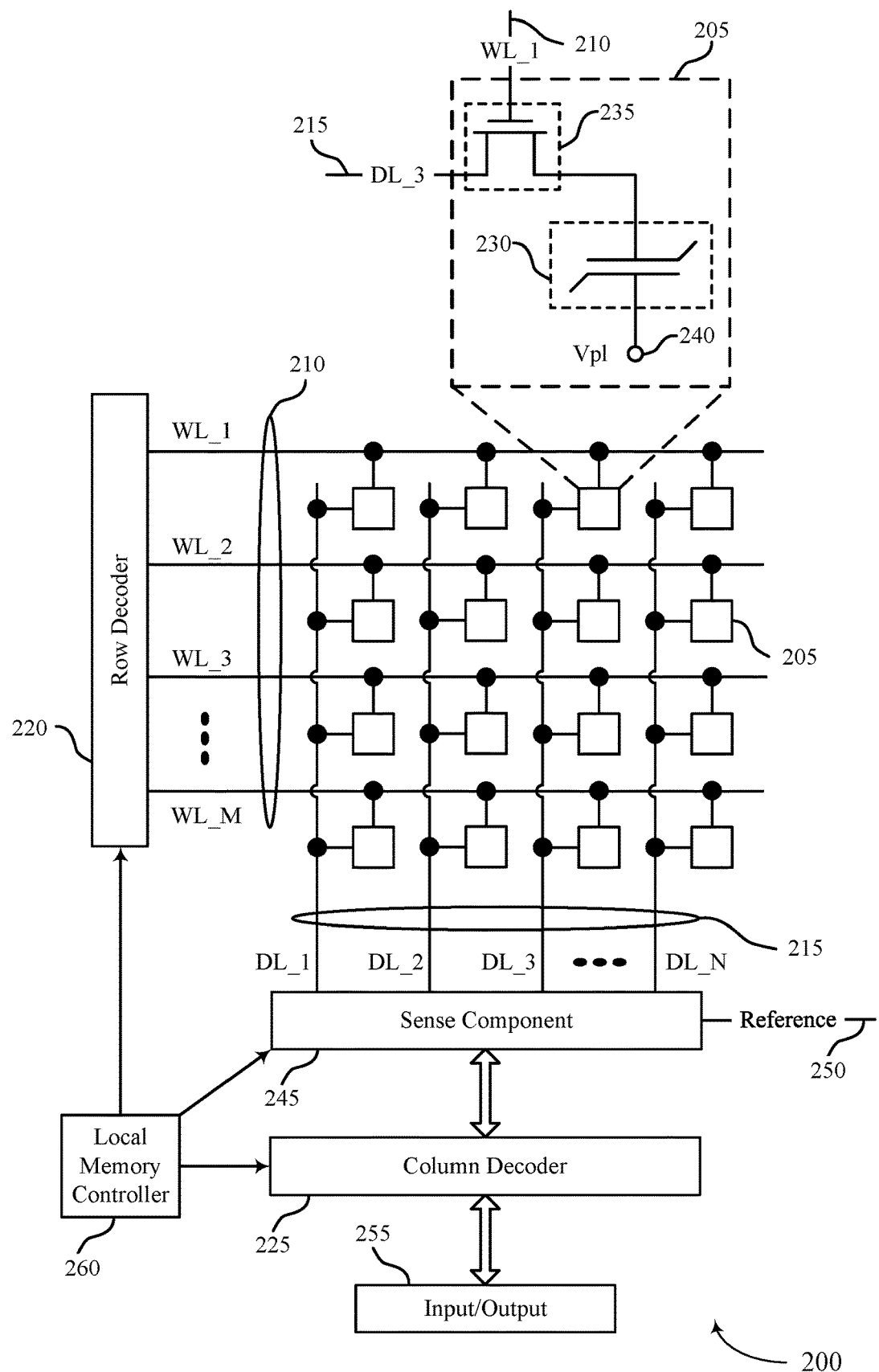
FIG. 2 illustrates an example of a memory die that supports sensing techniques using a charge transfer device in accordance with aspects of the present disclosure.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In some examples, the digit line may include (e.g., be coupled with) a charge transfer device configured to transfer charge between the digit line and the node of the sense component during a read operation. The charge transfer device may be implemented in order to improve sensing capabilities of memory cell 205 (e.g., of a multi-level memory cell configured to store three or more logic states). In some examples, the charge transfer device may be coupled with a node of at least a first sense component and a second sense component. A charge representable of the programmable states may be transferred to the node—via the charge transfer device—and may be sensed by at least one of the first sense component or the second sense component. The charge may represent, for example, one of four logic states stored to the memory cell 205 (e.g., logic "00", logic "01", logic "10", or "logic "11). In some examples, if memory cell 205 is configured to store four logic states, three sense components may be implemented Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220, a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl. In some cases, the voltage source 240 may be an example of a plate line coupled with a plate line driver. The switching component 235 may be an example of a transistor or any other type of switch device that selectively establishes or de-establishes electronic communication between two components. In some examples, memory cell 205 may be or may be referred to as a multi-level memory cell. Stated another way, memory cell 205 may be configured to store three or more states (e.g., three or more logic states).

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the threshold voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

As described above, the digit line 215 may be coupled with a charge transfer device (e.g., a transistor), which may be coupled with multiple sense components. In some examples, the digit line 215 may be configured to receive a charge from (e.g., to be biased by) memory cell 205. Stated another way, memory cell 205 may be discharged onto digit line 215, which may bias the digit line to a particular voltage. The voltage of the digit line may thus be representative of or related to a logic state stored to memory cell 205. For example, if memory cell 205 were to store a logic "0" and be discharged onto digit line 215, the digit line may be biased to a different voltage than if memory cell 205 were to store a logic "1" and be discharged onto digit line 215. In some examples, the charge transfer device may transfer the voltage discharged onto the digit line 215 to each of the sense components, which may determine a logic state of the memory cell 205.

The sense component 245 may be configured to detect state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge.

During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225. In some examples, multiple sense components may be coupled with memory cell 205, and each memory cell may be configured to sense a voltage of a node coupled thereto.

As described above, memory cell 205 may be discharged onto digit line 215 and, in some examples, the charge transfer device may transfer the resulting charge to the node. Accordingly, the node may discharge at a rate that is related to an amount of charge that was transferred. The sense components may sense the voltage of the node, described below with reference to FIGS. 3 through 5, in order to determine the logic state of the memory cell. For example, each sense component may be configured to sense a voltage (e.g., a signal) on the node using a fixed reference voltage, different reference voltages, at a same time, at different times, or a combination thereof. In some examples, a number of sense components implemented may be related to a number of logic states memory cell 205 is configured to store. For example, if memory cell 205 is configured to store three logic states, two sense components may be implemented. In some examples, a charge transfer device may improve a quality of the signal (e.g., of the charge) transferred to the node coupled with the sense components. For example, the signal transferred to the sense components may be amplified such that the difference between a reference voltage and the signal is more profound, resulting in an improved sensing operation. Stated another way, this may result in the sense components more-accurately sensing the logic state of the memory cell 205. In some examples, the sense component 245 may operate with greater accuracy particularly as it relates to multi-level memory cells.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

As described above with reference to FIG. 1, the local memory controller 260 may cause a charge to be transferred between the digit line 215 and a node coupled with a first sense component and a second sense component. In some examples, the first sense component may sense a signal on the node at a first time based at least in part on transferring the charge between the digit line 215 and the node. Additionally or alternatively, the second sense component may sense the signal on the node at a second time different than the first time based at least in part on transferring the charge between the digit line 215 and the node. The local memory controller 260 may then determine a logic state of the memory cell based at least in part on sensing the signal by the first sense component and sensing the signal by the second sense component. In some examples, each of the sense components may sense the respective signal using a fixed reference voltage or by using a different reference voltage.

In other examples, the memory cell 205 may be sensed by the local memory controller 260 causing a charge to be transferred between the digit line 215 and the node. The first sense component may sense a signal on the node at a time using a first reference value based at least in part on transferring the charge between the digit line 215 and the node.

Additionally or alternatively, the second sense component may sense the signal on the node at the time using a second reference value based at least in part on transferring the charge between the digit line 215 and the node. The local memory controller 260 may then determine a logic state of the multi-level memory cell based at least in part on sensing the signal by the first sense component and sensing the signal by the second sense component. In some examples, each of the sense components may sense the respective signal using a fixed reference voltage or by using a different reference voltage. Additionally or alternatively, in the examples described above, the local memory controller 260 may implement at least a third sense component to determine the logic state of the memory cell 205.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference signal 250.

Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
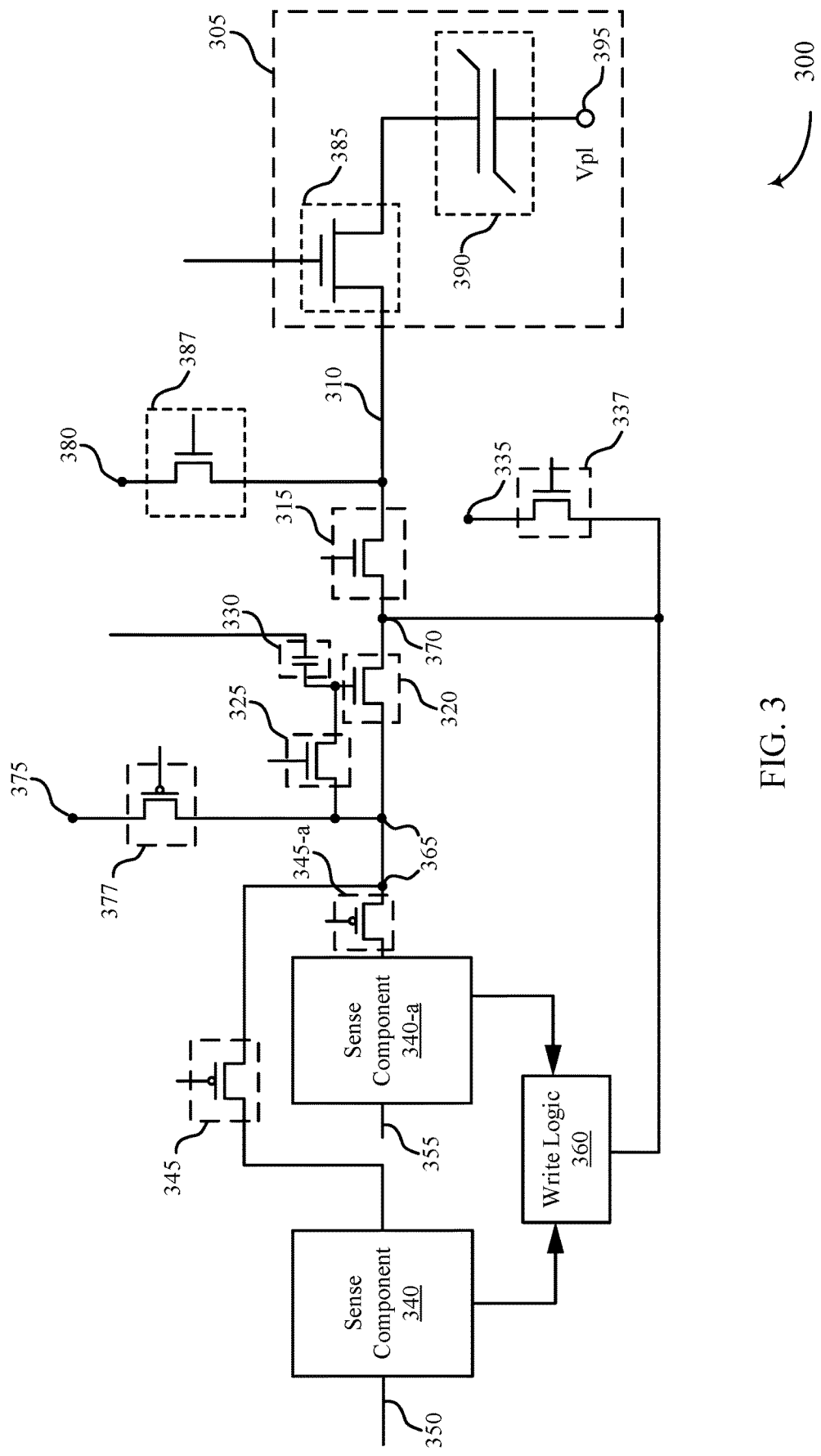
FIG. 3 illustrates an example circuit that supports sensing techniques using a charge transfer device in accordance with aspects of the present disclosure.

FIG. 3 illustrates an example circuit 300 that supports sensing techniques using a charge transfer device in accordance with aspects of the present disclosure. In some examples, circuit 300 may include one or more components described above with reference to FIGS. 1 and 2. For example, circuit 300 may include a memory cell 305, which may be an example of memory cell 205 as described with reference to FIG. 2; a digit line 310, which may be an example of digit line 215 as described with reference to FIG. 2; and a first sense component 340 and a second sense component 340-*a*, which each may be examples of sense component 245 as described with reference to FIG. 2. Circuit 300 may include an isolation device 315, a charge transfer device 320, a compensation device 325, a capacitor 330, a voltage source 335, a transistor 345, a transistor 345-*a*, a reference voltage 350, and a reference voltage 355. In some examples, the circuit 300 may include a write logic block 360, a node 365, a node 370, a voltage source (e.g., a CT precharge voltage) 375, and a voltage source (e.g., DVC2) 380. In some examples, the memory cell 305 may include a transistor (e.g., a switching component) 385, a capacitor 390, and a voltage source 395. In some examples, the voltage source 395 may be the cell plate reference voltage, such as Vpl. In some examples, the charge transfer device 320 may be referred to as a first transistor, the compensation device 325 may be referred to as a second transistor, the isolation device 315 may be referred to as a third transistor, and the transistor 345 and transistor 345-*a* may each be referred to as a switching device.

In some examples, memory cell 305 may be indirectly coupled with node 365, which may be coupled with first sense component 340 and second sense component 340-*a*. For example, memory cell 305 may be coupled with digit line 310, which may be coupled with isolation device 315. Additionally or alternatively, isolation device 315 may be coupled with charge transfer device 320, which may be coupled with node 365. In some examples, as described above, memory cell 305 may be discharged onto digit line 310. Thus, in some examples, the resulting voltage of the digit line 310 (e.g., a resulting charge on digit line 310) may be transferred to node 365 by way of isolation device 315 and charge transfer device 320. The transfer may occur, in part, based on whether isolation device 315 is active (or inactive) and a voltage applied to the gate of charge transfer device 320.

The charge transfer device 320 may be coupled with isolation device 315, compensation device 325, capacitor 330, and node 365. The charge transfer device 320 may be, in some examples, a transistor (e.g., a first transistor). Accordingly, a gate of the charge transfer device 320 may be coupled with the compensation device 325 and the capacitor 330, a source of the charge transfer device 320 may be coupled with isolation device 315 (e.g., which is coupled with memory cell 305), and a drain of the charge transfer device 320 may be coupled with node 365. The charge transfer device 320 may be configured to transfer a charge (e.g., a charge received at its source) based on a voltage of the digit line 310 being less than a voltage of the gate of the charge transfer device 320. Stated another way, a voltage may be applied to the gate of charge transfer device 320 to activate the charge transfer device 320 based on a voltage applied to the source of the charge transfer device 320. With the charge transfer device 320 being activated, the device may transfer a charge to the node 365 to be sensed by first sense component 340 and/or second sense component 340-*a*.

A read operation performed by the circuit 300 may be divided into different phases. A precharge phase may be used to precharge the node 365 (e.g., CT precharge voltage) and/or the digit line (e.g., DVC2) to their respective precharge voltages. A compensation phase may be used to set a gate voltage for the gate of the charge transfer device 320. A cell dump phase may be used to dump the state (e.g., the charge) of the memory cell 305 onto the digit line 310. In some examples, the compensation phase and the cell dump phase may be performed serially. In some examples, the compensation phase and the cell dump phase may be performed, at least in part, concurrently. After the compensation phase, the compensation device 325 may be deactivated thereby causing the gate of the charge transfer device 320 to float. After the compensation device 325 is deactivated, the node 365 may be precharged a second time before a sense phase of the read operation begins. With the gate voltage of the charge transfer device 320 set and the memory cell 305 having dumped its charge onto the digit line 310, the sense phase may begin. To begin the sense phase, the isolation device 315 may be activated, thereby coupling the digit line 310 with the charge transfer device 320. The charge transfer device 320 may transfer a charge between the digit line 310 and the node 365 based on the state of the memory cell 305 and/or the gate voltage applied to the gate of the charge transfer device 320. The sense components 340 and 340-*a* may be configured to sense a signal on the node 365 after the charge is transferred. The state of the memory cell 305 may be determined based on the signal sensed at the node 365.

The read operation relies on the charge transfer device 320 to transfer varying amounts of charge between digit line and the node 365 based on the state stored on the memory cell 305. In order to transfer a charge to or from the node 365, a gate of the charge transfer device 320 may be biased to a first voltage. The first voltage may be equivalent to or may be based in part on a voltage of the digit line 310 and the threshold voltage of the charge transfer device 320. In some cases, the first voltage may be equal to the precharge voltage of the digit line 310 and a threshold voltage of the charge transfer device 320. In some examples, the gate of the charge transfer device 320 may be biased to a first voltage based on a voltage being applied to node 365 from voltage source 375. A memory device may include multiple charge transfer devices (e.g., for multiple digit lines). Because each charge transfer device may have a unique threshold voltage, having at least one compensation device 325 for each charge transfer device may allow for the gate voltage applied to the charge transfer device 320 to account for the unique threshold voltage. Using this, a memory device may increase the uniformity of the read operation across the memory device even though threshold voltages may vary. In some cases, capacitor 330 may be configured to maintain the gate of the charge transfer device 320 at a fixed voltage (e.g., at a first voltage).

In order to conduct a sensing operation on memory cell 305, a gate of the charge transfer device 320 may be biased to a first voltage. The first voltage may be equivalent to or may be based in part on a precharge voltage of the digit line 310 plus the threshold voltage of the charge transfer device 320. The first voltage applied to the gate of the charge transfer device 320 may result in the charge transfer device 320 being activated based on a state stored on the memory cell 305. In some examples, the gate of the charge transfer device 320 may be biased to a first voltage based on a precharge voltage being applied to node 365. In some examples, the memory cell 305 may be discharged onto the digit line 310 after the first voltage is applied to the gate of the charge transfer device 320.

The compensation device 325 may be configured to apply a voltage to the gate of the charge transfer device 320 that compensates for a threshold voltage of the charge transfer device 320. As part of biasing the gate of the charge transfer device 320 to the first voltage, the voltage applied to node 365 may be removed and the isolation device 315 activated. In such cases, node 365 may be coupled with a precharged digit line 310. The voltage on the node 365 may relax to a voltage that is the precharge value of the digit line 310 plus the threshold voltage of the charge transfer device 320. After the first voltage is set, the compensation device 325 may be deactivated and the gate of the charge transfer device 320 may be caused to float. Capacitor 330 may be implemented in order to maintain the gate of the charge transfer device 320 at a fixed voltage (e.g., at a first voltage).

In some examples, the memory cell 305 may be discharged onto the digit line 310. Accordingly, by discharging the memory cell 305, the digit line 310 may be biased to a voltage (e.g., to a second voltage), which may be based on a logic state stored to the memory cell 305. For example, the digit line 310 may be biased to a different voltage if the memory cell 305 were to store a logic "1" state, then if the memory cell 305 were to store a logic "0" state.

The charge transfer device 320 may transfer the charge on the digit line 310 to the node 365 under certain conditions. Due to the charge transfer device 320 being activated (e.g., due to the first voltage applied to the gate), the charge from the memory cell 305 may be transferred to the sense component 340 if the second voltage is less than the first voltage. Because the charge across the digit line 310 and the resulting voltage applied to the gate of the charge transfer device 320 may be associated with a logic state of the memory cell 305, the charge transfer device 320 may activate to varying degrees based on a particular logic state being stored to the memory cell 305. In some cases, the degree to which the charge transfer device 320 is activated is based on the gate voltage applied to the charge transfer device 320 and the voltage applied to the source of the charge transfer device 320 (e.g., voltage on the digit line that is based on the logic state stored in the memory cell 305).

In a first example of the read operation, the compensation phase and the cell dump phase are performed serially. Meaning that the cell dump phase does not begin until the compensation phase is complete. To begin the compensation phase, a gate voltage may be applied to the gate of the charge transfer device 320. The value of the gate voltage applied to the charge transfer device 320 may affect the amount of charge transferred during the read operation. In some cases, the gate voltage may be set to be around the precharge voltage of the digit line 310 plus the threshold voltage of the charge transfer device 320. To bias the gate of the charge transfer device 320 to the first voltage (e.g., the gate voltage), the node 365 may be biased to a precharge voltage (e.g., CT precharge voltage). During this time, the compensation device 325 may be activated such that the gate of the charge transfer device 320 is also biased to the precharge voltage. The digit line 310 may also be precharged to its precharge voltage (e.g., DVC2). After the node 365 and the digit line 310 are precharged, the node 365 may be isolated from the voltage source 375 by deactivating the transistor 377.

In addition, the isolation device 315 may be activated such that the node 365 and the digit line 310 are coupled through the charge transfer device 320 and the isolation device 315. Upon coupling the node 365 and the digit line 310, the node 365 may begin to discharge. Eventually, the voltage on the node 365 (and the gate of the charge transfer device 320) may discharge to the first voltage value that is approximately the precharge voltage of the digit line 310 (e.g., DVC2) plus the threshold voltage (e.g., Vth) of the charge transfer device 320 (e.g., DVC2+Vth). After the gate voltage of the charge transfer device 320 is set, the compensation device 325 may be deactivated, causing the gate of the charge transfer device 320 to float. In addition, the isolation device 315 may be deactivated thereby isolating the digit line 310 from the charge transfer device 320 before the cell dump phase of the read operation begins. The read operation may move onto other phases of the operation, including dumping the value stored in the memory cell 305 onto the digit line 310, transferring the charge between the digit line 310 and the node 365, and sensing the signal on the node 365.

During the cell dump phase, the transistor 385 may be activated thereby coupling the capacitor 390 of the memory cell 305 to the digit line 310. The memory cell 305 may then discharge its stored charge onto the digit line 310 thereby biasing the digit line 310 to a second voltage different than the precharge voltage.

During the cell dump phase, the node 365 may be precharged to a second precharge voltage (e.g., sense precharge voltage). In some cases, the second precharge voltage is different than the first precharge voltage. In some cases, the second precharge voltage is the same as the first precharge voltage. The second precharge voltage may be set at a level such that charge may be transferred between the node 365 and the digit line 310 during the sensing phase.

After the cell dump phase is complete, the sensing phase may begin by activating the isolation device 315. The digit line 310, biased to a second voltage, may be coupled with the node 365, biased to the second precharge voltage, by the charge transfer device 320. Based on the value of the first voltage applied to the gate of the charge transfer device 320 and the second voltage on the digit line 310, the charge transfer may transfer a varying amount of charge between the node 365 and the digit line 310. For example, if second voltage is much less than the first voltage, a large amount of charge may be transferred, or if the second voltage is slightly less than the first voltage, a smaller amount of charge may be transferred. The sense components 340 and 340-a may detect a signal (e.g., a charge) on the node 365 after the charge is transferred. A logic state stored to the memory cell 305 may be determined based on the signals sensed by the sense components 340 and 340-a. Additional details about the sense phase are described with reference to FIGS. 4 and 5.

In a second example of the read operation, the compensation phase and the cell dump phase are performed at least partially concurrently. Meaning that the cell dump phase begins before the compensation phase is complete. This is accomplished by using a different voltage source (e.g., voltage source 335) other than digit line 310 to apply the first voltage to the gate of the charge transfer device 320. In some cases, the gate voltage of the charge transfer device 320 may also be set at a value that is different than precharge voltage of the digit line 310 plus the threshold voltage of the charge transfer device 320.

Additionally or alternatively, the circuit 300 may include voltage source 335, which may be coupled with node 370 (e.g., via a transistor 337). In some examples, node 370 may be referred to as a node of the charge transfer device 320, and the voltage source 335 may be configured to apply a voltage to node 370 so that the compensation phase of the read operation may occur concurrently with the cell dump phase of the read operation. Said another way, the gate voltage of the charge transfer device 320 may be set using the voltage source 335 rather than the digit line 310 (biased to a precharge voltage, DVC2), thereby allowing another operation to occur on the digit line 310 while the gate of the charge transfer device 320 is being set. To bias the gate of the charge transfer device 320 using the voltage source 335, the node 365 may be biased to a precharge voltage. During this time, the compensation device 325 may be activated such that the gate of the charge transfer device 320 is also precharged to the precharge voltage. After the node 365 is biased to the precharge voltage, the voltage source 335 may be coupled to the node 370 using the transistor 337. The voltage may be applied when isolation device 315 is deactivated (e.g., is in an "off" position). The precharge voltage may cease being applied to the node 365 and the node 365 may discharge to a level that is the value of the voltage source 335 plus the voltage threshold of the charge transfer device 320. The value of the voltage source 335 may set to be the precharge voltage of the digit line 310 (e.g., DVC2) or a value around the precharge voltage of the digit line (e.g., DVC2±φ). The gate of the charge transfer device 320 may be biased to a first voltage at least partially concurrent with the memory cell 305 being discharged onto the digit line 310. After setting the gate voltage of the gate of the charge transfer device 320, the voltage source 335 may be isolated from the node 370 and/or the compensation device 325 may be deactivated.

After biasing the gate of the charge transfer device 320 (e.g., to a first voltage) using the voltage source 335, a cell dump phase may occur. During the cell dump phase, the transistor 385 may be activated thereby coupling the capacitor 390 of the memory cell 305 to the digit line 310. The memory cell 305 may then discharge its stored charge onto the digit line 310 thereby biasing the digit line 310 to a second voltage different than the precharge voltage. Before this occurs, the digit line 310 may be isolated from the voltage source 380 used to precharge the digit line by deactivating the transistor 387.

After the compensation phase but before the sensing phase, the node 365 may be precharged to a second precharge voltage (e.g., sense precharge voltage). In some cases, the second precharge voltage is different than the first precharge voltage. In some cases, the second precharge voltage is the same as the first precharge voltage. The second precharge voltage is set at a level such that charge may be transferred between the node 365 and the digit line 310 during the sensing phase.

After the cell dump phase is complete, the sensing phase may begin by activating the isolation device 315. The digit line 310, biased to a second voltage, may be coupled with the node 365, biased to the second precharge voltage, by the charge transfer device 320. Based on the value of the first voltage applied to the gate of the charge transfer device 320 and the second voltage on the digit line 310, the charge transfer may transfer a varying amount of charge between the node 365 and the digit line 310. For example, if second voltage is much less than the first voltage, a large amount of charge may be transferred, or if the second voltage is slightly less than the first voltage, a smaller amount of charge may be transferred. The sense components 340 and 340-a may detect a signal (e.g., a charge) on the node 365 after the charge is transferred. A logic state stored on the memory cell 305 may be determined based on the signals sensed by the sense components 340 and 340-a. Additional details about the sense phase are described with reference to FIGS. 4 and 5.

During the sensing phase, the node 365 may begin to discharge based on the voltage on the digit line 310. The node 365 may discharge at different rates depending on the voltage on the digit line 310. In some cases, the voltage on the digit line 310 means that the charge transfer device 320 does not transfer any charge or transfers very little charge (e.g., when the voltage on the digit line 310 is greater than the voltage on the gate of the charge transfer device 320) For example, if the memory cell 305 discharged a logic "0" value onto the digit line 310, the node 365 may discharge more quickly than, for example, if the memory cell 305 discharged a logic "1" value onto the digit line 310. Thus, by sensing the voltage value of the node 365 (e.g., by first sense component 340 and second sense component 340-a), a logic state of the memory cell 305 may be determined.

In some examples, first sense component 340 and second sense component 340-a may sense the signal at node 365 using a fixed reference value at different times (e.g., at a first time and at a second time). Stated another way, the first sense component 340 may be provided with a same reference voltage (e.g., reference voltage 465 described with reference to FIG. 4) as the second sense component 340-a. A transistor 345 may be activated (e.g., turned to an "on" position) such that first sense component 340 may receive the signal of the node 365. The first sense component 340 may conduct a sense operation by comparing the signal of the node 365 to reference voltage 350. This sense operation may occur at a first time.

In some examples, the transistor 345 may then be deactivated (e.g., turned to an "off" position) such that the signal of the node 365 may not be received by the first sense component 340. To conduct the sense operation, the transistor 345-a may be activated (e.g., turned to an "on" position) such that the second sense component 340-a may receive the signal of the node 365. The second sense component 340-a may then conduct a sense operation by comparing the signal of the node 365 to a reference voltage 355. In some examples, the transistor 345-a may then be deactivated (e.g., turned to an "off" position). This sense operation may occur, for example, at a second time different than (e.g., after) the first time. The resulting values of sensing the signal of the node 365 using the first sense component 340 and the second sense component 340-a may be used to determine the logic state of the memory cell 305. For example, if memory cell 305 was configured to store three logic states, the resulting logic state may be a logic "0", a logic "mid", or a logic "1" value. A logic "mid" may be, in some examples, either a logic "01" or a logic "10" value. In some examples, using a fixed reference voltage may reduce the noise associated with changing the reference voltage during the sensing period. The noise may be reduced, for example, because a reference voltage of the second sense component 340-a would not need to be updated and/or applied to the second sense component 340-a after a first sense operation.

In some examples, the first sense component 340 and the second sense component 340-a may sense the signal of node 365 using a different fixed reference values at a same time (e.g., reference voltage 465 and reference voltage 460 described with reference to FIG. 4). Stated another way, the first sense component 340 may be provided with a first reference voltage (e.g., reference voltage 465) and the second sense component 340-a may be provided with a second reference voltage (e.g., a different reference voltage 460). In some examples the reference voltages may be offset (e.g., by a predetermined voltage value).

A transistor 345 and a transistor 345-a may each be activated (e.g., turned to an "on" position) such that the first sense component 340 and the second sense component 340-a may receive a signal (e.g., a charge) of the node 365 at a same time. The first sense component 340 and the second sense component 340-a may conduct a sense operation simultaneously by comparing the signal of the node 365 to reference voltage 350 and reference voltage 355, respectively. The resulting values of sensing the signal on the node 365 at the first sense component 340 and the second sense component 340-a may be used to determine the logic state of the memory cell 305. For example, if memory cell 305 was configured to store three logic states, the resulting logic state may be a logic "00", a logic "mid", or a logic "11" value. A logic "mid" may be, in some examples, either a logic "01" or a logic "10" value. In some examples, a simultaneous sense operation (e.g., sensing the signal of node 365 via the first sense component 340 and the second sense component 340-a simultaneously) may improve the timing of a read operation. Additionally or alternatively, in the examples described above, a sensing operation may occur using the first sense component 340 and the second sense component 340-a by using any combinations of a fixed reference voltage, different reference voltages, a fixed timing operation, and different timing operations.

In other examples, the memory cell 305 may be configured to store four logic states (e.g., "00", "01", "10", or "11"). Using the same techniques as described above, the logic state of the memory cell 305 may be determined. In some examples, to determine a logic state of a memory cell configured to store four logic states, a third sense component (not shown) may be implemented. For example, a third sense component may be coupled with node 365 using an additional transistor (not shown) configured to isolate the third sense component from the first sense component 340 and the second sense component 340-a at different times during the sensing operation.

Accordingly, in some examples, the first sense component 340, the second sense component 340-a, and the third sense component may sense the voltage of node 365 using a fixed reference value at different times (e.g., at a first time, at a second time, and at a third time). Stated another way, the first sense component 340 may be provided with a same reference voltage (e.g., reference voltage 350) as second sense component 340-a (e.g., reference voltage 355), and the third sense component (e.g., an additional reference voltage). The second sense component 340-a and the third sense component may be isolated from the first sense component 340 by activating transistor 345, such that first sense component 340 may receive a signal of the node 365. The first sense component 340 may conduct a sense operation by comparing the signal of the node 365 to the reference voltage 350. This sense operation may occur at a first time.

In some examples, the transistor 345 may be deactivated (e.g., turned to an "off" position) such that the signal of node 365 may not be received by the first sense component 340 or the third sense component. The second sense component 340-a may then conduct a sense operation by first activating transistor 345-a and comparing the signal of the node 365 to the reference voltage 355. This sense operation may occur, for example, at a second time different than (e.g., after) the first time. The transistor 345 may remain deactivated (e.g., turned to an "off" position) such that the signal of node 365 may not be received by the first sense component 340 and the second sense component 340-a. The third sense component may then conduct a sense operation by comparing the signal of the node 365 to an additional (e.g., a fixed) reference voltage. This sense operation may occur, for example, at a third time different than (e.g., after) the first time and the second time. In some examples, the transistor 345 and the transistor 345-a may each be deactivated during the third sense operation.

The resulting values of sensing the signal of the node 365 at the first sense component 340, the second sense component 340-a, and the third sense component may be used to determine the logic state of the memory cell 305. For example, if memory cell 305 was configured to store four logic states, the resulting logic state of the memory cell 305 may be a logic "00", a logic "01", a logic "10", or a logic "11" value.

In yet another example, the first sense component 340, the second sense component 340-a, and the third sense component may sense the signal of node 365 using different fixed reference values at a same time. Stated another way, the first sense component 340 may be provided with a first reference voltage (e.g., reference voltage 350), the second sense component 340-a may be provided with a second reference voltage (e.g., reference voltage 355), and the third sense component may be provided with a third reference voltage (e.g., different than reference voltage 350 and reference voltage 355). In some examples the reference voltages may be offset (e.g., by a predetermined voltage value).

To determine the logic state of the memory cell 305, at least the transistor 345 and the transistor 345-a may be activated such that first sense component 340, the second sense component 340-a, and the third sense component may receive a signal (e.g., a charge) of the node 365 at a same time. The first sense component 340, the second sense component 340-a, and the third sense component may conduct a sense operation simultaneously by comparing the signal of the node 365 to reference voltage 350, reference voltage 355, and an additional reference voltage (e.g., associated with the third sense component) respectively. The resulting values of sensing the signal of the node 365 at the first sense component 340, the second sense component 340-a, and the third sense component may be used to determine the logic state of the memory cell 305. For example, if memory cell 305 was configured to store four logic states, the resulting logic state may be a logic "00", a logic "01", a logic "10", or a logic "11" value. Additionally or alternatively, in the examples described above, a sensing operation may occur using first sense component 340, second sense component 340-a, and third sense component by using any combinations of a fixed reference voltage, different reference voltages, a fixed timing operation, and different timing operations.

In some examples, each of the sense components (e.g., first sense component 340, second sense component 340-a, and/or a third sense component) may be coupled with write logic block 360. In some examples, the write logic block 360 may be configured to write a logic value to the memory cell based on a sense operation. As described above, a sense operation may be conducted on a memory cell configured to store either three logic states or four logic states, using any combination of a fixed reference voltage, different reference voltages, a fixed timing operation, and different timing operations. Thus, the determined logic value of memory cell 305, using any of the aforementioned methods, may be written back to memory cell 305 using write logic block 360.

Figure 4:
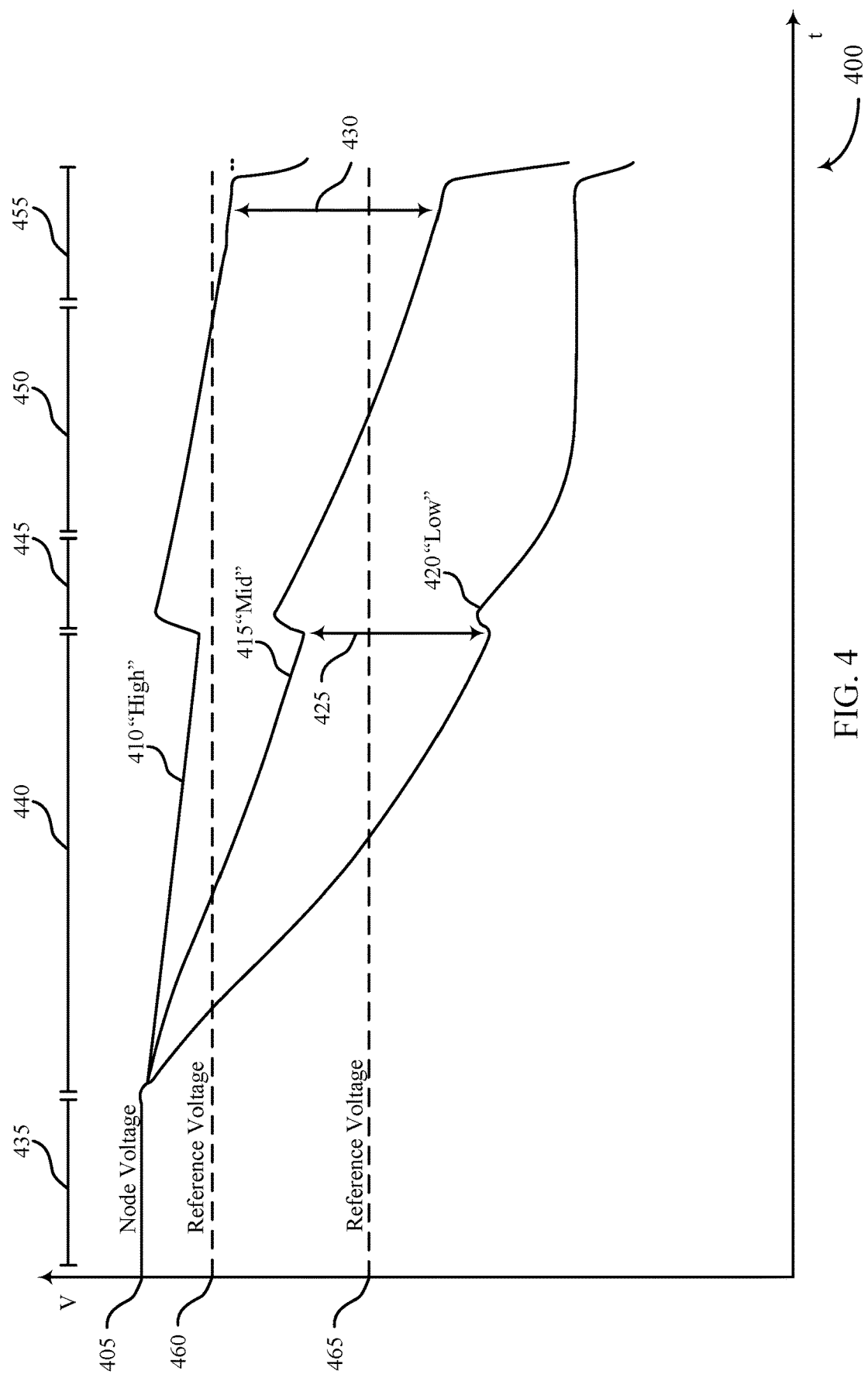
FIGS. 4 and 5 illustrate example timing diagrams that each support sensing techniques using a charge transfer device in accordance with aspects of the present disclosure.

FIG. 4 illustrates an example of a timing diagram 400 that supports sensing techniques using a charge transfer device in accordance with aspects of the present disclosure. The timing diagram 400 may illustrate an operation of the circuit 300 as described with reference to FIG. 3. Thus, timing diagram 400 may illustrate the operation of one or more components described above with reference to FIGS. 1, 2, and 3. For example, timing diagram 400 may illustrate the voltage of a node (e.g., node 365 as described with reference to FIG. 3) as applied to a first sense component (e.g., sense component 340 as described with reference to FIG. 3) and a second sense component (e.g., sense component 340-a as described with reference to FIG. 3). The voltage 405 may represent a voltage of the node based on the state stored on the memory cell. Timing diagram 400 may also illustrate a reference voltage 465 and a reference voltage 460. In some examples, a circuit may apply a single fixed reference voltage (e.g., reference voltage 465) to multiple sense components to determine the logic state stored on the memory cell. In some examples, a circuit may apply multiple fixed reference voltages (e.g., reference voltage 465 and reference voltage 460) to different sense components to determine logic state stored on the memory cell. In such examples, the second reference voltage 460 may be used in read operations where both sense amplifiers activate at the same time. In some examples, the voltages 410, 415, and 420 (e.g., high, mid, and low) may be different possibilities of signals on the node based on the different states that can be stored on the memory cell.

A node (e.g., node 365 as described with reference to FIG. 3) coupled with a charge transfer device (e.g., charge transfer device 320 as described with reference to FIG. 3) may be precharged to a first voltage. For example, the node may be precharged by a voltage source coupled with the node and a compensation device. In some examples, the node may be precharged to 1.5V. After precharging the node, a compensation operation may occur, and the node may begin to discharge. Subsequently, a memory cell (e.g., memory cell 305 as described with reference to FIG. 3) may be discharged onto a digit line (e.g., digit line 310 as described with reference to FIG. 3). Accordingly, the digit line voltage may be biased to a second voltage based on the logic state stored to the memory cell.

At 435, a precharge voltage may be applied to the node coupled with the charge transfer device (e.g., re-applying the first precharge voltage to the node), and may be applied to the node coupled with the first sense component and the second sense component via the charge transfer device. Thus, during 435, the voltage of the node may be maintained at a constant (e.g., a fixed) voltage value.

At 440, the node coupled with the first sense component and the second sense component may be coupled with the digit line. This may signal the beginning of a sense phase of the read operation. To accomplish this, in some cases, the isolation device (e.g., isolation device 315 described with reference to FIG. 3) may be activated. The node may begin to discharge based on the voltage on the digit line (e.g., based on the state stored on the memory cell). In some examples, the rate at which the node discharges may be based on the state stored on the memory cell. Additionally or alternatively, if the charge transfer device transfers a charge between the digit line and the node, the node may discharge at a second (e.g., a faster) rate. Thus, the voltage of the node may correspond to a particular logic state of the memory cell based on transferring the charge between the digit line and the node (e.g., voltages 410, 415, and 420 at high, mid, and low levels, respectively, may each correspond to a different logic state of the memory cell).

At 445, a first sense operation may occur at a first time. For example, the first sense component (e.g., the sense component 340 described with reference to FIG. 3) may sense a signal on the node (e.g., the sense component may be fired). During the first sense operation, the voltage of the node may be compared with reference voltage 465 by the first sense component. Because the rate at which the node discharges may be based on a logic state of the memory cell, comparing the voltage 405 with the reference voltage 465 may indicate a logic state of the memory cell. For example, the first sense amplifier may be configured to distinguish between a first logic state and two other logic states by comparing the signal on the node to a reference signal positioned between the first logic state and the second logic state. Hence, an additional sense amp may be used to distinguish between the second logic state and the third logic state.

At 450, a duration may pass between a first sense operation and a second sense operation. For example, at 430, the transistor coupled with the first sense component and the second sense component may be deactivated (e.g., transistor 345 and transistor 345-a as described with reference to FIG. 3). This may isolate the first sense component from the second sense component, such that the voltage of the node may be sensed by the second sense component during a second sense operation. In addition, during this duration, the signal on the node may discharge and/or continue to discharge.

At 455, a second sense operation may occur at a second time after the first time. During the second sense operation, the voltage of the node may be sensed by the sense component and compared with reference voltage 465. Because the rate at which the node discharges may be based on the state stored on the memory cell, comparing the voltage 405 with the reference voltage 465 may indicate a logic state of the memory cell. Additionally or alternatively, by using a charge transfer device, the sensing window 425 and the sensing window 430 may be improved, thus resulting in a more accurate sensing operation, among other benefits.

In some examples, a logic state of the memory cell may be determined based on both the first sense operation and the second sense operation. For example, the first sense component may compare voltage 405 with the reference voltage 465. Based on a difference between the voltages, the first sense component may determine a "1" or a "0" value. Subsequently, the second sense component may compare voltage 405 with the reference voltage 465 and, based on the difference between the voltages, may determine a "1" or a "0" value. Accordingly, based on the sense operations, the logic state of the memory cell may be determined to be a logic "00", "01", or "11" value.

In some examples, a first sense operation and second sense operation may occur at a same time (e.g., at a first time). For example, the first sense component and the second sense component (e.g., the sense component 340 described with reference to FIG. 3) may each sense a signal on the node. During the sense operation, the voltage of the node may be transferred to the first sense component and the second sense component and be compared with reference voltage 465 and reference voltage 460, respectively. Stated another way, during a sense operation where the first sense component and the second sense component operate concurrently, voltage 405 may be compared with the reference voltage 465 by the first sense component and voltage 405 may be compared with the reference voltage 460 by the second sense component (or vice-versa).

Because the rate at which the node discharges may be based on whether the charge transfer device transfers a charge from the digit line, and whether the charge transfer device transfers a charge from the digit line may be based on a logic state of the memory cell, comparing the voltage 405 with the reference voltage 465 and the reference voltage 460, respectively, may indicate a logic state of the memory cell. For example, the first sense amplifier may be configured to distinguish between a first logic state and two other logic states, and the second sense amplifier may be used to distinguish between the second logic state and the third logic state by comparing the signal on the node to a reference signal positioned between the second logic state and the third logic state.

Figure 5:
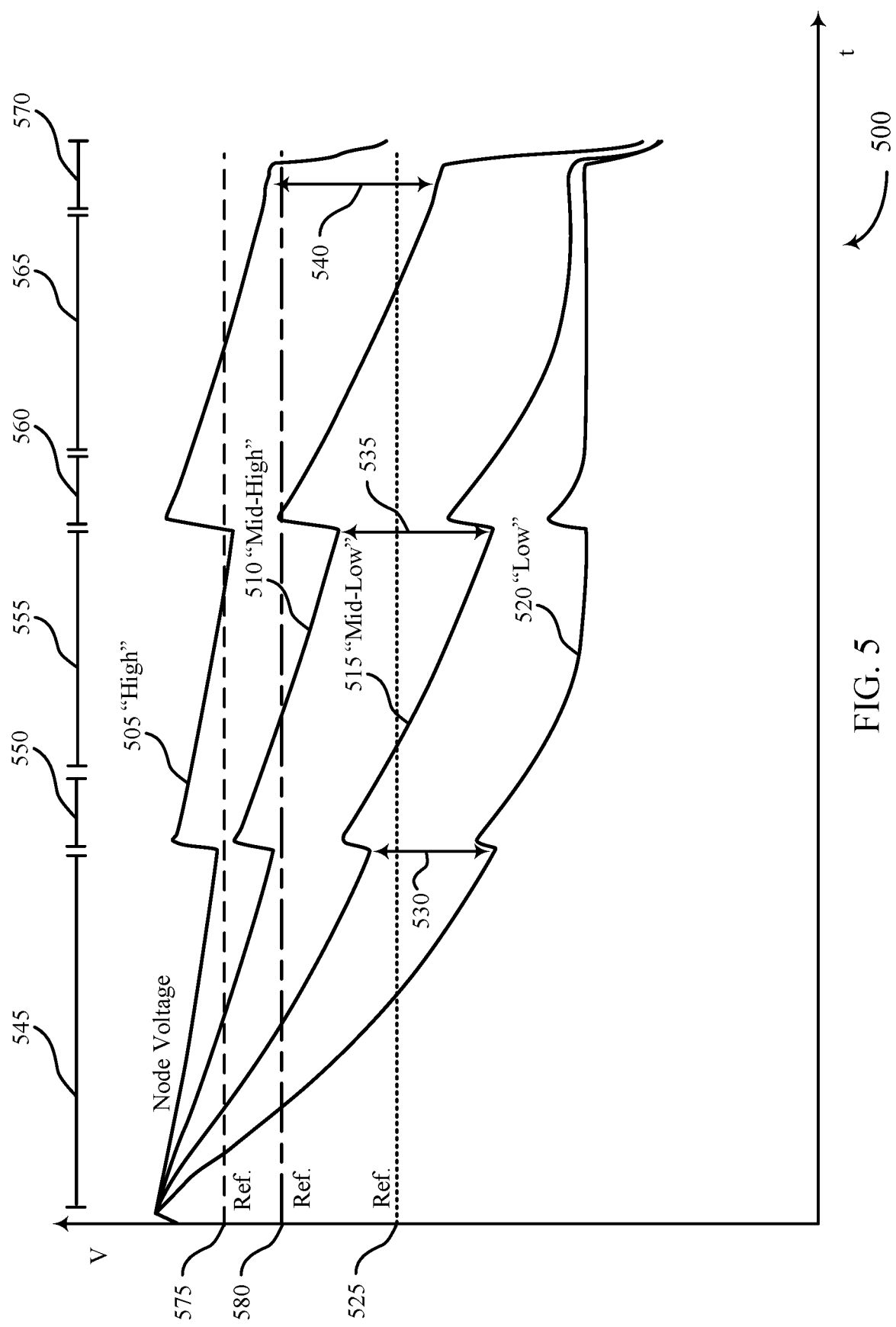

FIG. 5 illustrates an example timing diagram 500 that supports sensing techniques using a charge transfer device in accordance with aspects of the present disclosure. In some examples, timing diagram 500 may illustrate a portion of read operation for a memory cell that stores four states. The timing diagram 500 may illustrate an operation of circuit similar to the circuit 300 described with reference to FIG. 3, except that the a third sense component may be coupled with the node 365. Thus, timing diagram 500 may illustrate the operation of one or more components described above with reference to FIGS. 1, 2, and 3. For example, timing diagram 500 may illustrate the voltage of a node (e.g., node 365 as described with reference to FIG. 3) as applied to a first sense component (e.g., sense component 340 as described with reference to FIG. 3), a second sense component (e.g., sense component 340-a as described with reference to FIG. 3), and a third sense component. In some examples, the voltages 505, 510, 515, and 520 may be different possibilities of signals on the node based on the different states that are stored on the memory cell. The voltages 505, 510, 515, and 520 may represent a high-level, a high-mid-level, a low-mid-level, and a low level, respectively, and may each correspond to a different logic state stored by the memory cell. Timing diagram 500 may also include reference voltage 525, reference voltage 575, and reference voltage 580. Reference voltage 575 and reference voltage 580 may be used in examples where a first sense component, second sense component, and third sense component fire at a same time.

As described above, a node (e.g., node 365 as described with reference to FIG. 3) coupled with the charge transfer device (e.g., charge transfer device 320 as described with reference to FIG. 3) may be precharged to a first voltage. For example, the node may be precharged by a voltage source coupled with the node and a compensation device. In some examples, the node may be precharged to 1.5V. After precharging the node, a compensation operation may occur, and the node may begin to discharge. Subsequently, a memory cell (e.g., memory cell 305 as described with reference to FIG. 3) may be discharged onto a digit line (e.g., digit line 310 as described with reference to FIG. 3). Accordingly, the digit line voltage may be biased to a second voltage based on the logic state stored to the memory cell.

At 545, the node coupled with the first sense component, the second sense component, and the third sense component may be coupled with the digit line. In some examples, this may signal the beginning of a sense phase of the read operation. To accomplish this the isolation device (e.g., isolation device 315 described with reference to FIG. 3) may be activated. The node may begin to discharge based on the voltage on the digit line (e.g., based on the state stored on the memory cell). In some examples, the rate at which the node discharges may be based on the state stored on the memory cell Additionally or alternatively, if the charge transfer device transfers a charge from the digit line to the node, the node may discharge at a second (e.g., a faster) rate. Thus the voltage of the node may correspond to a particular logic state of the memory cell At 550, a first sense operation may occur at a first time. For example, the first sense component (e.g., the sense component 340 described with reference to FIG. 3) may sense a signal on the node. During the first sense operation, the voltage of the node may be transferred to the sense component and compared with reference voltage 525. Stated another way, during a first sense operation, the signal on the node may be compared with the reference voltage 525 by the first sense component. Because the rate at which the node discharges may be based on whether the charge transfer device transfers a charge from the digit line, and whether the charge transfer device transfers a charge from the digit line may be based on a logic state of the memory cell, comparing the signal on the node with the reference voltage 525 may indicate a logic state of the memory cell. For example, the first sense amplifier may be configured to distinguish between a first logic state and three other logic states.

At 555, a duration may pass between a first sense operation and a second sense operation. For example, at 555, the at least one transistor coupled with the first sense component, the second sense component, and the third sense component may be deactivated. This may isolate the first sense component and the third sense component from the second sense component, such that the voltage of the node may be sensed by the second sense component during a second sense operation. In addition, during this duration, the signal on the node may continue to discharge.

At 560, a second sense operation may occur at a second time. For example, the second sense component (e.g., the sense component 340-a described with reference to FIG. 3) may sense a signal on the node. During the second sense operation, the voltage of the node may be compared with reference voltage 525 by the second sense component. Because the rate at which the node discharges may be based on whether the charge transfer device transfers a charge from the digit line, and whether the charge transfer device transfers a charge from the digit line may be based on a logic state of the memory cell, comparing the signal on the node with the reference voltage 525 may indicate a logic state of the memory cell. For example, the second sense amplifier may be configured to distinguish between a second logic state and a third logic state.

At 565, a duration may pass between a second sense operation and a third sense operation. For example, at 565, the at least one transistor coupled with the first sense component, the second sense component, and/or the third sense component may be deactivated. This may isolate the first sense component and the second sense component from the third sense component, such that the voltage of the node may be sensed by the third sense component during a third sense operation. In addition, during this duration, the signal on the node may continue to discharge.

At 570, a third sense operation may occur at a third time. For example, the third sense component may sense a signal on the node. During the third sense operation, the voltage of the node may be compared with reference voltage 525 by the third sense component. Because the rate at which the node discharges may be based on whether the charge transfer device transfers a charge from the digit line, and whether the charge transfer device transfers a charge from the digit line may be based on a logic state of the memory cell, comparing the signal on the node with the reference voltage 525 may indicate a logic state of the memory cell. For example, the third sense amplifier may be configured to distinguish between a third logic state and a fourth logic state. Additionally or alternatively, by implementing a charge transfer device, the sensing window 530, the sensing window 535, and the sensing window 540 may be improved, thus resulting in a more accurate sensing operation.

In some examples, a logic state of the memory cell may be determined based on each of the first sense operation, the second sense operation, and the third sense operation. For example, the first sense component may compare the signal on the node with the reference voltage 525. Based on a difference between the voltages, the first sense component may determine a "1" or a "0" value. Subsequently, the second sense component may compare the signal on the node with the reference voltage 525 and, based on the difference between the voltages, may determine a "1" or a "0" value. Additionally or alternatively, the third sense component may compare the signal on the node with the reference voltage 525 and, based on the difference between the voltages, may determine a "00", "01", "10", or "11" value based on both the first sense operation and the second sense operation. Thus, based on each of the sense operations, the logic state of the memory cell may be determined to be a logic "00", "01", "10", or "11" value.

In some examples, a first sense operation, a second sense operation, and a third sense operation may occur at a same time (e.g., at a first time). For example, the first sense component, the second sense component, and the third sense component may each sense a signal on the node. During the sense operation, the signal of the node may be compared with reference voltage 525, reference voltage 575, and reference voltage 580, respectively, at the same time. Stated another way, during a sense operation where the first sense component, the second sense component, and the third sense component fire concurrently, the signal on the node may be compared with the reference voltage 525 by the first sense component, the signal on the node may be compared with the reference voltage 580 by the second sense component, and the signal on the node may be compared with the reference voltage 575 by the third sense component.

Because the rate at which the node discharges may be based on whether the charge transfer device transfers a charge from the digit line, and whether the charge transfer device transfers a charge from the digit line may be based on a logic state of the memory cell, comparing the signal on the node with the reference voltage 525, the reference voltage 575, and the reference voltage 580, respectively, may indicate a logic state of the memory cell. For example, the first sense amplifier may be configured to distinguish between a first logic state and three other logic states, the second sense amplifier may be used to distinguish between the second logic state and the third logic state, and the third sense amplifier may be used to distinguish between the third logic state and the fourth logic state.

Figure 6:
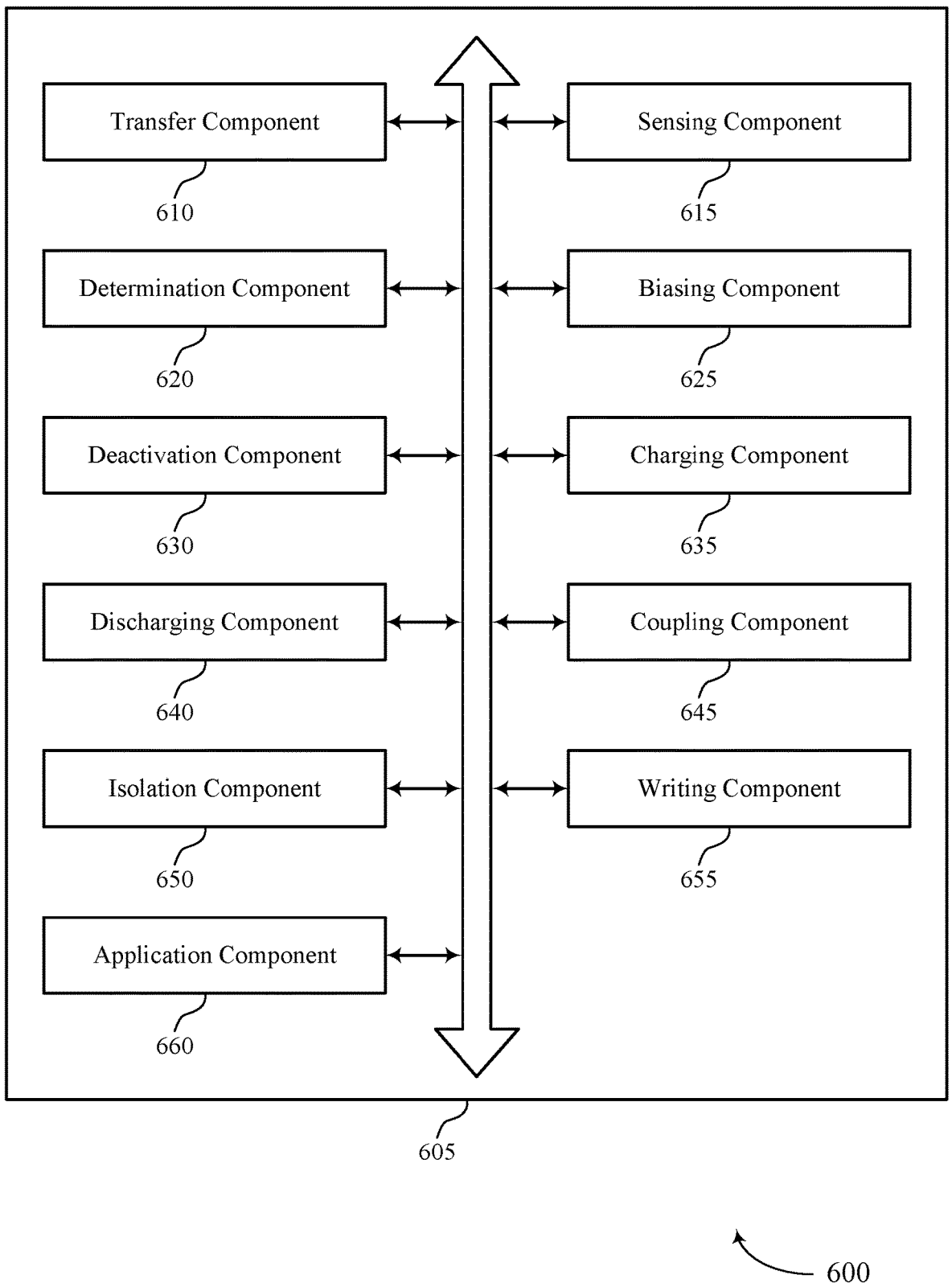
FIG. 6 illustrates a block diagram of a device that supports sensing techniques using a charge transfer device in accordance with aspects of the present disclosure.

FIG. 6 shows a block diagram 600 of a charge transfer component 605 that supports sensing techniques using a charge transfer device in accordance with aspects of the present disclosure. The charge transfer component 605 may be an example of aspects of a memory controller (e.g., external memory controller 105 as described with reference to FIG. 1) The charge transfer component 605 may include transfer component 610, sensing component 615, determination component 620, biasing component 625, deactivation component 630, charging component 635, discharging component 640, coupling component 645, isolation component 650, writing component 655, and application component 660. Each of these components may communicate, directly or indirectly, with one another (e.g., via one or more buses).

Transfer component 610 may transfer, using a first transistor, a charge between a digit line and a node coupled with a first sense component and a second sense component based at least in part on a first voltage on the digit line being less than a second voltage on a gate of the first transistor. In some examples, transfer component 610 may transfer, using a first transistor, a charge between a digit line and a node of a first sense component and a second sense component during a read operation, wherein the charge is transferred based at least in part on a first voltage on the digit line being less than a second voltage on a gate of the first transistor.

Sensing component 615 may sense, by the first sense component, a signal on the node at a first time based at least in part on transferring the charge between the digit line and the node. In some examples, sensing component 615 may sense, by the second sense component, the signal on the node at a second time different than the first time based at least in part on transferring the charge between the digit line and the node. In some examples, sensing component 615 may sense the signal at the first sense component comprises comparing the signal on the node to a fixed reference value at the first time and sense the signal at the second sense component comprises comparing the signal on the node to the fixed reference value at the second time.

In some examples, sensing component 615 may sense, by a third sense component coupled with the digit line using the first transistor, the signal on the node at the time using a third reference value based at least in part on transferring the charge between the digit line and the node, wherein determining the logic state of the multi-level memory cell is based at least in part on sensing the signal at the third sense component.

In some examples, sensing component 615 may sense, using a third sense component coupled with the digit line using the first transistor, the signal on the node at a third time different than the second time based at least in part on transferring the charge between the digit line and the node, wherein determining the logic state of the multi-level memory cell is based at least in part on sensing the signal using the third sense component. In some examples, sensing component 615 may sense, by the first sense component, a signal on the node at a time using a first reference value based at least in part on transferring the charge between the digit line and the node. In some examples, sensing component 615 may sense, by the second sense component, the signal on the node at the time using a second reference value based at least in part on transferring the charge between the digit line and the node.

Determination component 620 may determine a logic state of a multi-level memory cell based at least in part on sensing the signal by the first sense component and sensing the signal by the second sense component. In some examples, determination component 620 may determine a logic state of a multi-level memory cell coupled with the digit line based at least in part on sensing the signal by the first sense component and sensing the signal by the second sense component. In some examples, determination component 620 may determine the second voltage on the gate of the first transistor.

Biasing component 625 may bias the gate of the first transistor to the second voltage before transferring the charge between the digit line and the node. In some examples, biasing component 625 may bias the digit line to the first voltage based at least in part on discharging the multi-level memory cell onto the digit line. In some examples, biasing component 625 may bias the gate of the first transistor to the second voltage based at least in part on applying the third voltage. In some examples, biasing component 625 may bias the digit line to the first voltage based at least in part on discharging the multi-level memory cell onto the digit line. In some examples, biasing component 625 may bias the gate of the first transistor to the second voltage before transferring the charge between the digit line and the node.

Deactivation component 630 may deactivate a second transistor coupled with the node and the first sense component after sensing the signal on the node at the first time, wherein deactivating the second transistor isolates the first sense component from the second sense component during at least a portion of a read operation.

Charging component 635 may charge the node coupled with the first sense component, the second sense component, and the first transistor to a third voltage.

Discharging component 640 may discharge the multi-level memory cell onto the digit line based at least in part on biasing the gate of the first transistor. In some examples, discharging component 640 may discharge the node onto the gate of the first transistor while the first transistor is coupled with the digit line. In some examples, discharging component 640 may discharge the multi-level memory cell to the digit line concurrent with biasing the gate of the first transistor.

In some examples, discharging component 640 may discharge the multi-level memory cell onto the digit line based at least in part on applying the second voltage to the gate of the first transistor, wherein the digit line is biased to the first voltage based at least in part on discharging the multi-level memory cell onto the digit line. In some examples, discharging component 640 may discharge the multi-level memory cell to the digit line concurrent with biasing the gate of the first transistor, wherein the digit line is biased to the first voltage based at least in part on discharging the multi-level memory cell onto the digit line.

Coupling component 645 may couple the digit line with the first transistor after discharging the multi-level memory cell onto the digit line. In some examples, coupling component 645 may couple the digit line with the first transistor after discharging the multi-level memory cell to the digit line. In some examples, coupling component 645 may couple the digit line with the first transistor after discharging the multi-level memory cell onto the digit line. In some examples, coupling component 645 may couple the digit line with the first transistor after discharging the multi-level memory cell to the digit line.

Isolation component 650 may isolate the digit line from the first transistor after biasing the gate of the first transistor to the second voltage. In some examples, isolation component 650 may isolate the digit line from the first transistor after biasing the gate of the first transistor to the second voltage.

Writing component 655 may write the determined logic state to the multi-level memory cell after the read operation.

Application component 660 may apply a third voltage from a voltage source to a second node of the first transistor while the second node of the first transistor is isolated from the digit line. In some examples, application component 660 may apply a third voltage from a voltage source to a second node of the first transistor based at least in part on determining the second voltage on the gate.

Figure 7:
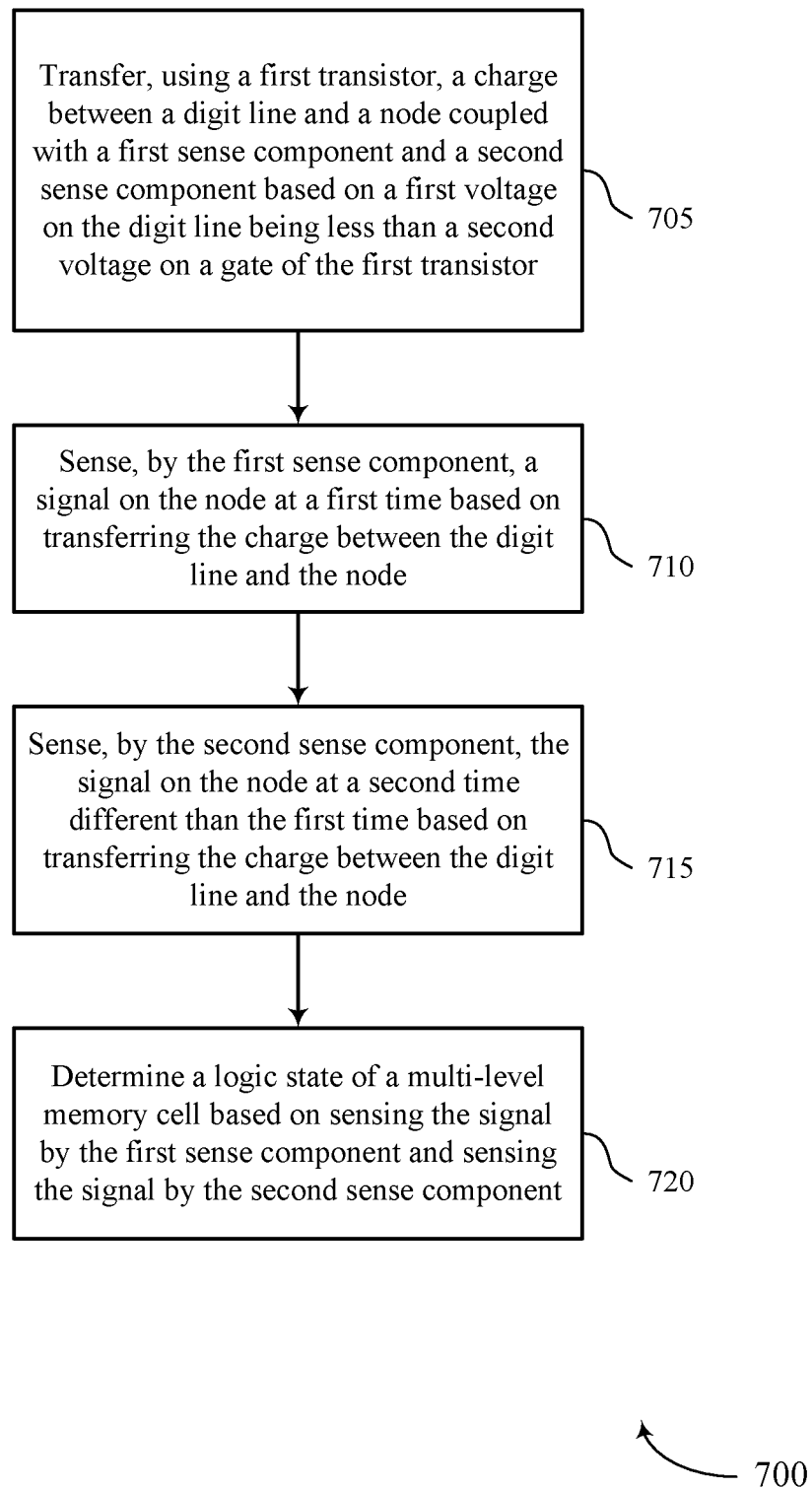
FIGS. 7 through 10 show flowcharts illustrating a method or methods that support sensing techniques using a charge transfer device in accordance with aspects of the present disclosure.

FIG. 7 shows a flowchart illustrating a method 700 that supports sensing techniques using a charge transfer device in accordance with aspects of the present disclosure. The operations of method 700 may be implemented by a controller or its components as described herein. For example, the operations of method 700 may be performed by a controller as described with reference to FIG. 1. In some examples, a memory device may execute a set of instructions to control the functional elements of the memory device to perform the functions described below. Additionally or alternatively, a memory device may perform aspects of the functions described below using special-purpose hardware.

At 705, a charge may be transferred between a digit line and a node coupled with a first sense component and a second sense component, using a first transistor, based on a first voltage on the digit line being less than a second voltage on a gate of the first transistor. In some examples, aspects of the operations of 705 may be performed by a transfer component as described with reference to FIG. 6.

At 710, a signal on the node may be sensed at a first time, by the first sense component, based on transferring the charge between the digit line and the node. In some examples, aspects of the operations of 710 may be performed by a sensing component as described with reference to FIG. 6.

At 715, the signal on the node may be sensed at a second time different than the first time, by the second sense component, based on transferring the charge between the digit line and the node. In some examples, aspects of the operations of 715 may be performed by a sensing component as described with reference to FIG. 6.

At 720, a logic state of a multi-level memory cell may be determined based on sensing the signal by the first sense component and sensing the signal by the second sense component. In some examples, aspects of the operations of 720 may be performed by a determination component as described with reference to FIG. 6.

Figure 8:
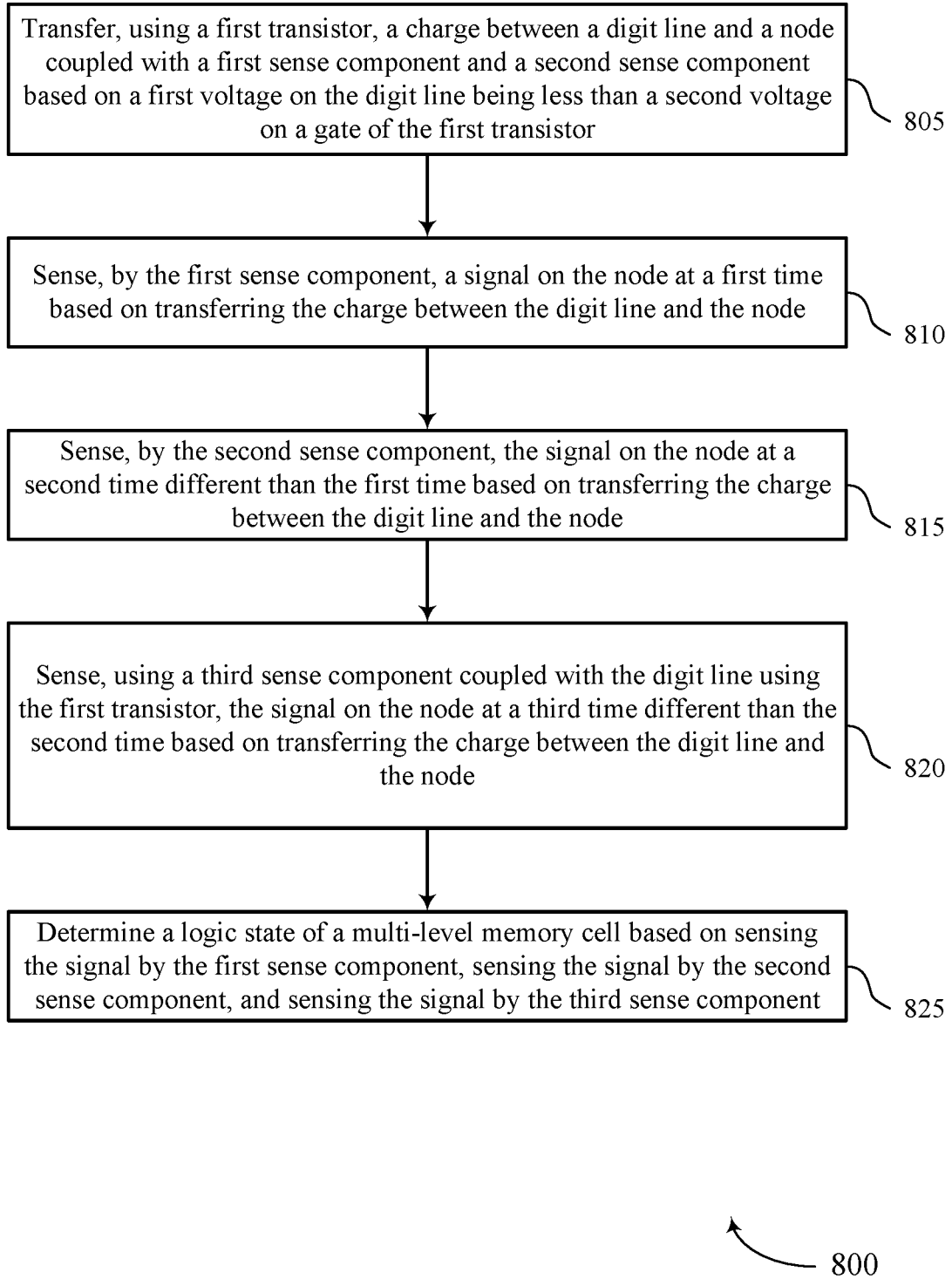

FIG. 8 shows a flowchart illustrating a method 800 that supports sensing techniques using a charge transfer device in accordance with aspects of the present disclosure. The operations of method 800 may be implemented by a controller or its components as described herein. For example, the operations of method 800 may be performed by a controller as described with reference to FIG. 1. In some examples, a memory device may execute a set of instructions to control the functional elements of the memory device to perform the functions described below. Additionally or alternatively, a memory device may perform aspects of the functions described below using special-purpose hardware.

At 805, a charge may be transferred between a digit line and a node coupled with a first sense component and a second sense component, using a first transistor, based on a first voltage on the digit line being less than a second voltage on a gate of the first transistor. In some examples, aspects of the operations of 805 may be performed by a transfer component as described with reference to FIG. 6.

At 810, a signal on the node may be sensed at a first time, by the first sense component, based on transferring the charge between the digit line and the node. In some examples, aspects of the operations of 810 may be performed by a sensing component as described with reference to FIG. 6.

At 815, the signal on the node may be sensed at a second time different than the first time, by the second sense component, based on transferring the charge between the digit line and the node. In some examples, aspects of the operations of 815 may be performed by a sensing component as described with reference to FIG. 6.

At 820, the signal on the node may be sensed at a third time different than the second time, using a third sense component coupled with the digit line using the first transistor, based on transferring the charge between the digit line and the node. In some examples, aspects of the operations of 820 may be performed by a sensing component as described with reference to FIG. 6.

At 825, a logic state of a multi-level memory cell may be determined based on sensing the signal by the first sense component, sensing the signal by the second sense component, and sensing the signal by the third sense component. In some examples, aspects of the operations of 825 may be performed by a determination component as described with reference to FIG. 6.

Figure 9:
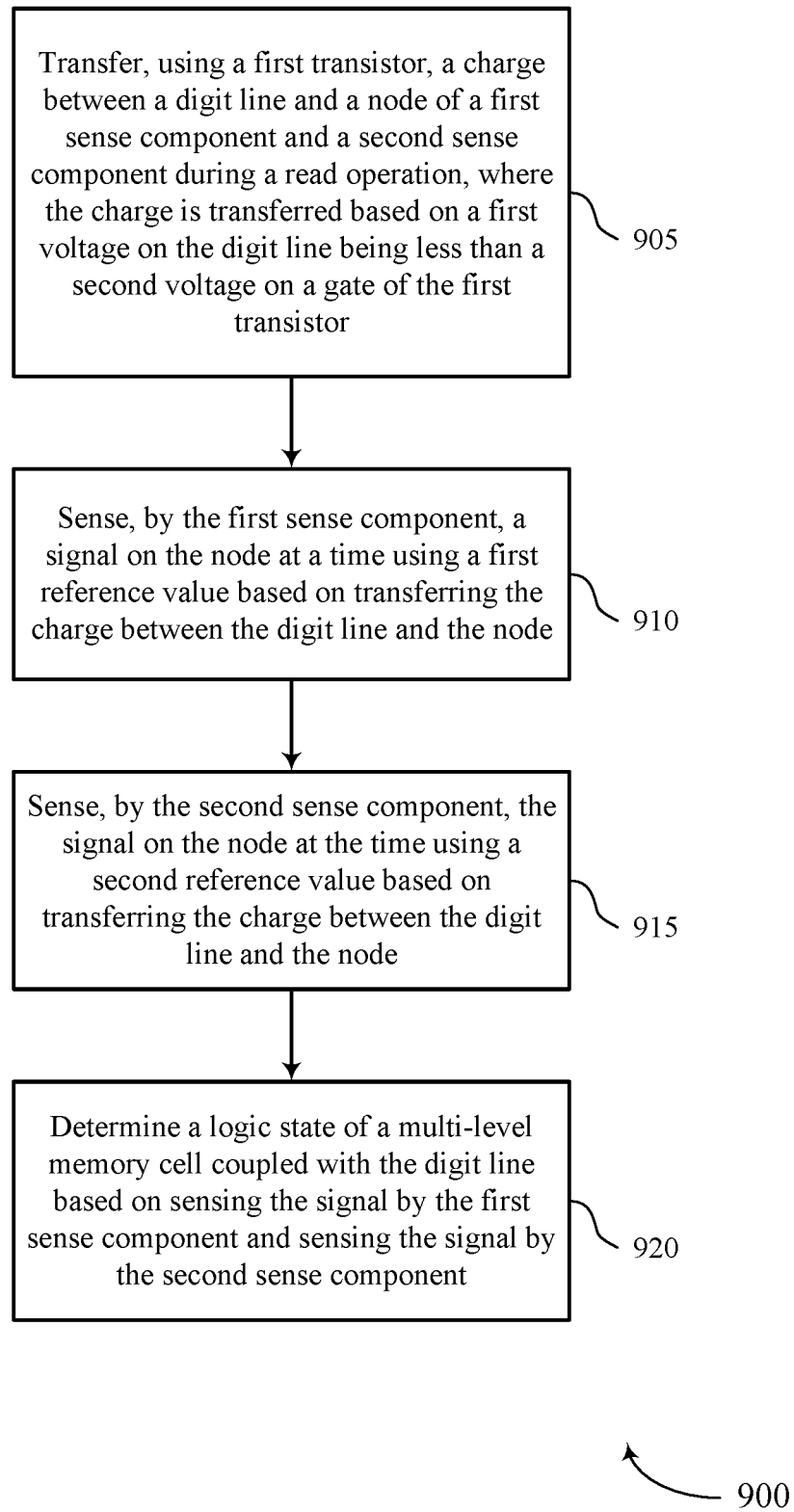

FIG. 9 shows a flowchart illustrating a method 900 that supports sensing techniques using a charge transfer device in accordance with aspects of the present disclosure. The operations of method 900 may be implemented by a controller or its components as described herein. For example, the operations of method 900 may be performed by a controller as described with reference to FIG. 1. In some examples, a memory device may execute a set of instructions to control the functional elements of the memory device to perform the functions described below. Additionally or alternatively, a memory device may perform aspects of the functions described below using special-purpose hardware.

At 905, a charge between a digit line and a node of a first sense component and a second sense component may be transferred, using a first transistor, during a read operation. In some examples, the charge may be transferred based on a first voltage on the digit line being less than a second voltage on a gate of the first transistor. In some examples, aspects of the operations of 905 may be performed by a transfer component as described with reference to FIG. 6.

At 910, a signal on the node may be sensed, by the first sense component, at a time using a first reference value based on transferring the charge between the digit line and the node. In some examples, aspects of the operations of 910 may be performed by a sensing component as described with reference to FIG. 6.

At 915, the signal on the node may be sensed, by the second sense component, at the time using a second reference value based on transferring the charge between the digit line and the node. In some examples, aspects of the operations of 915 may be performed by a sensing component as described with reference to FIG. 6.

At 920, a logic state of a multi-level memory cell coupled with the digit line may be determined based on sensing the signal by the first sense component and sensing the signal by the second sense component. In some examples, aspects of the operations of 920 may be performed by a determination component as described with reference to FIG. 6.

Figure 10:
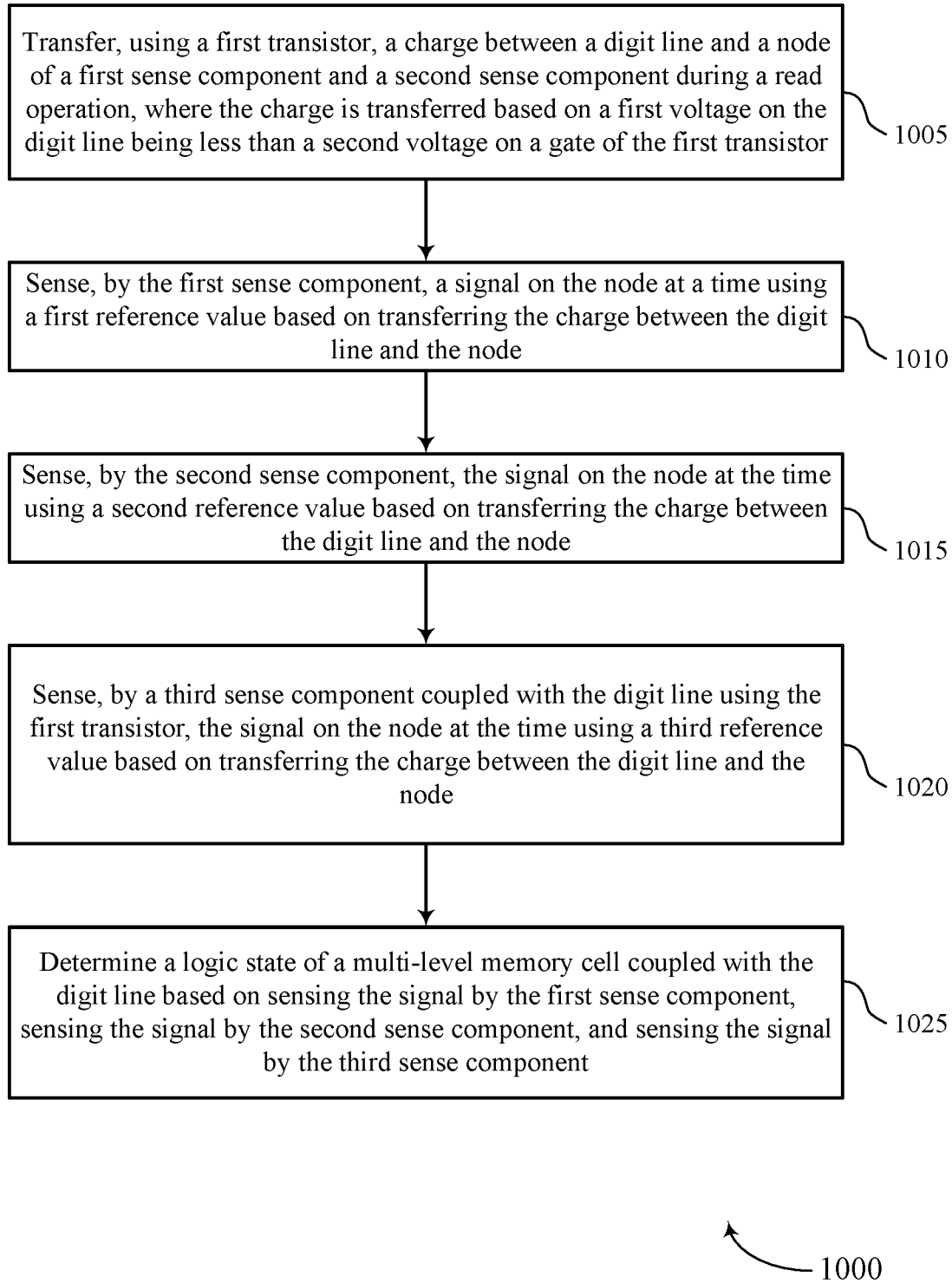

FIG. 10 shows a flowchart illustrating a method 1000 that supports sensing techniques using a charge transfer device in accordance with aspects of the present disclosure. The operations of method 1000 may be implemented by a controller or its components as described herein. For example, the operations of method 1000 may be performed by a controller as described with reference to FIG. 1. In some examples, a memory device may execute a set of instructions to control the functional elements of the memory device to perform the functions described below. Additionally or alternatively, a memory device may perform aspects of the functions described below using special-purpose hardware.

At 1005, a charge between a digit line and a node of a first sense component and a second sense component may be transferred, using a first transistor, during a read operation. In some examples, the charge may be transferred based on a first voltage on the digit line being less than a second voltage on a gate of the first transistor. In some examples, aspects of the operations of 1005 may be performed by a transfer component as described with reference to FIG. 6.

At 1010, a signal on the node may be sensed, by the first sense component, at a time using a first reference value based on transferring the charge between the digit line and the node. In some examples, aspects of the operations of 1010 may be performed by a sensing component as described with reference to FIG. 6.

At 1015, the signal on the node may be sensed, by the second sense component, at the time using a second reference value based on transferring the charge between the digit line and the node. In some examples, aspects of the operations of 1015 may be performed by a sensing component as described with reference to FIG. 6.

At 1020, the signal on the node may be sensed, by a third sense component, at the time using a third reference value based on transferring the charge between the digit line and the node. The operations of 1020 may be performed according to the methods described herein. In some examples, aspects of the operations of 1020 may be performed by a sensing component as described with reference to FIG. 6.

At 1025, a logic state of a multi-level memory cell coupled with the digit line may be determined based on sensing the signal by the first sense component, sensing the signal by the second sense component, and sensing the signal by the third sense component. In some examples, aspects of the operations of 1025 may be performed by a determination component as described with reference to FIG. 6.

A method is described. In some examples, the method may include transferring, using a first transistor, a charge between a digit line and a node coupled with a first sense component and a second sense component based at least in part on a first voltage on the digit line being less than a second voltage on a gate of the first transistor, sensing, by the first sense component, a signal on the node at a first time based at least in part on transferring the charge between the digit line and the node, sensing, by the second sense component, the signal on the node at a second time different than the first time based at least in part on transferring the charge between the digit line and the node, and determining a logic state of a multi-level memory cell based at least in part on sensing the signal by the first sense component and sensing the signal by the second sense component.

In some examples, the sensing the signal at the first sense component may include comparing the signal on the node to a fixed reference value at the first time and sensing the signal at the second sense component may include comparing the signal on the node to the fixed reference value at the second time. In some examples, the method may include sensing, using a third sense component coupled with the digit line using the first transistor, the signal on the node at a third time different than the second time based at least in part on transferring the charge between the digit line and the node, wherein determining the logic state of the multi-level memory cell is based at least in part on sensing the signal using the third sense component. In some examples, the method may include deactivating a second transistor coupled with the node and the first sense component after sensing the signal on the node at the first time, wherein deactivating the second transistor isolates the first sense component from the second sense component during at least a portion of a read operation.

In some examples, the method may include biasing the gate of the first transistor to the second voltage before transferring the charge between the digit line and the node, discharging the multi-level memory cell onto the digit line based at least in part on biasing the gate of the first transistor, and biasing the digit line to the first voltage based at least in part on discharging the multi-level memory cell onto the digit line. In some examples, biasing the gate of the first transistor to the second voltage may include charging the node coupled with the first sense component, the second sense component, and the first transistor to a third voltage and discharging the node onto the gate of the first transistor while the first transistor is coupled with the digit line.

In some examples, the method may include isolating the digit line from the first transistor after biasing the gate of the first transistor to the second voltage. In some examples, the method may include coupling the digit line with the first transistor after discharging the multi-level memory cell onto the digit line. In some examples, the method may include applying a third voltage from a voltage source to a second node of the first transistor while the second node of the first transistor is isolated from the digit line and biasing the gate of the first transistor to the second voltage based at least in part on applying the third voltage.

In some examples, the method may include discharging the multi-level memory cell to the digit line concurrent with biasing the gate of the first transistor, biasing the digit line to the first voltage based at least in part on discharging the multi-level memory cell onto the digit line, and coupling the digit line with the first transistor after discharging the multi-level memory cell to the digit line. In some examples, the first transistor may be configured to transfer the charge between the digit line and the node of the first sense component and the second sense component during a read operation.

An apparatus is described. In some examples, the apparatus may support means for transferring, using a first transistor, a charge between a digit line and a node coupled with a first sense component and a second sense component based at least in part on a first voltage on the digit line being less than a second voltage on a gate of the first transistor, means for sensing, by the first sense component, a signal on the node at a first time based at least in part on transferring the charge between the digit line and the node, means for sensing, by the second sense component, the signal on the node at a second time different than the first time based at least in part on transferring the charge between the digit line and the node, and means for determining a logic state of a multi-level memory cell based at least in part on sensing the signal by the first sense component and sensing the signal by the second sense component.

In some examples, the means for sensing the signal at the first sense component may include means for comparing the signal on the node to a fixed reference value at the first time and the means for sensing the signal at the second sense component may include means for comparing the signal on the node to the fixed reference value at the second time. In some examples, the apparatus may support means for sensing, using a third sense component coupled with the digit line using the first transistor, the signal on the node at a third time different than the second time based at least in part on transferring the charge between the digit line and the node, wherein determining the logic state of the multi-level memory cell is based at least in part on sensing the signal using the third sense component. In some examples, the apparatus may support means for deactivating a second transistor coupled with the node and the first sense component after sensing the signal on the node at the first time, wherein deactivating the second transistor isolates the first sense component from the second sense component during at least a portion of a read operation.

In some examples, the apparatus may support means for biasing the gate of the first transistor to the second voltage before transferring the charge between the digit line and the node, means for discharging the multi-level memory cell onto the digit line based at least in part on biasing the gate of the first transistor, and means for biasing the digit line to the first voltage based at least in part on discharging the multi-level memory cell onto the digit line. In some examples, the means for biasing the gate of the first transistor to the second voltage may include means for charging the node coupled with the first sense component, the second sense component, and the first transistor to a third voltage and discharging the node onto the gate of the first transistor while the first transistor is coupled with the digit line.

In some examples, the apparatus may support means for isolating the digit line from the first transistor after biasing the gate of the first transistor to the second voltage. In some examples, the method may include coupling the digit line with the first transistor after discharging the multi-level memory cell onto the digit line. In some examples, the apparatus may support means for applying a third voltage from a voltage source to a second node of the first transistor while the second node of the first transistor is isolated from the digit line and means for biasing the gate of the first transistor to the second voltage based at least in part on applying the third voltage.

In some examples, the apparatus may support means for discharging the multi-level memory cell to the digit line concurrent with biasing the gate of the first transistor, means for biasing the digit line to the first voltage based at least in part on discharging the multi-level memory cell onto the digit line, and means for coupling the digit line with the first transistor after discharging the multi-level memory cell to the digit line. In some examples, the first transistor may be configured to transfer the charge between the digit line and the node of the first sense component and the second sense component during a read operation.

A method is described. In some examples, the method may include transferring, using a first transistor, a charge between a digit line and a node of a first sense component and a second sense component during a read operation, wherein the charge is transferred based at least in part on a first voltage on the digit line being less than a second voltage on a gate of the first transistor, sensing, by the first sense component, a signal on the node at a time using a first reference value based at least in part on transferring the charge between the digit line and the node, sensing, by the second sense component, the signal on the node at the time using a second reference value based at least in part on transferring the charge between the digit line and the node, and determining a logic state of a multi-level memory cell coupled with the digit line based at least in part on sensing the signal by the first sense component and sensing the signal by the second sense component.

In some examples, the method may include sensing, by a third sense component coupled with the digit line using the first transistor, the signal on the node at the time using a third reference value based at least in part on transferring the charge between the digit line and the node, wherein determining the logic state of the multi-level memory cell is based at least in part on sensing the signal at the third sense component. In some examples, the multi-level memory cell may be configured to store a first logic state, a second logic state, a third logic state, or a fourth logic state. In some examples, the method may include biasing the gate of the first transistor to the second voltage before transferring the charge between the digit line and the node and discharging the multi-level memory cell onto the digit line based at least in part on applying the second voltage to the gate of the first transistor, wherein the digit line is biased to the first voltage based at least in part on discharging the multi-level memory cell onto the digit line.

In some examples, the method may include isolating the digit line from the first transistor after biasing the gate of the first transistor to the second voltage and coupling the digit line with the first transistor after discharging the multi-level memory cell onto the digit line. In some examples, the method may include determining the second voltage on the gate of the first transistor and applying a third voltage from a voltage source to a second node of the first transistor based at least in part on determining the second voltage on the gate.

In some examples, the method may include discharging the multi-level memory cell to the digit line concurrent with biasing the gate of the first transistor, wherein the digit line is biased to the first voltage based at least in part on discharging the multi-level memory cell onto the digit line and coupling the digit line with the first transistor after discharging the multi-level memory cell to the digit line. In some examples, the method may include writing the determined logic state to the multi-level memory cell after the read operation.

An apparatus is described. In some examples, the apparatus may support means for transferring, using a first transistor, a charge between a digit line and a node of a first sense component and a second sense component during a read operation, wherein the charge is transferred based at least in part on a first voltage on the digit line being less than a second voltage on a gate of the first transistor, means for sensing, by the first sense component, a signal on the node at a time using a first reference value based at least in part on transferring the charge between the digit line and the node, means for sensing, by the second sense component, the signal on the node at the time using a second reference value based at least in part on transferring the charge between the digit line and the node, and means for determining a logic state of a multi-level memory cell coupled with the digit line based at least in part on sensing the signal by the first sense component and sensing the signal by the second sense component.

In some examples, the apparatus may support means for sensing, by a third sense component coupled with the digit line using the first transistor, the signal on the node at the time using a third reference value based at least in part on transferring the charge between the digit line and the node, wherein determining the logic state of the multi-level memory cell is based at least in part on sensing the signal at the third sense component. In some examples, the multi-level memory cell may be configured to store a first logic state, a second logic state, a third logic state, or a fourth logic state. In some examples, the apparatus may support means for biasing the gate of the first transistor to the second voltage before transferring the charge between the digit line and the node and means for discharging the multi-level memory cell onto the digit line based at least in part on applying the second voltage to the gate of the first transistor, wherein the digit line is biased to the first voltage based at least in part on discharging the multi-level memory cell onto the digit line.

In some examples, the apparatus may support means for isolating the digit line from the first transistor after biasing the gate of the first transistor to the second voltage and means for coupling the digit line with the first transistor after discharging the multi-level memory cell onto the digit line. In some examples, the apparatus may support means for determining the second voltage on the gate of the first transistor and means for applying a third voltage from a voltage source to a second node of the first transistor based at least in part on determining the second voltage on the gate.

In some examples, the apparatus may support means for discharging the multi-level memory cell to the digit line concurrent with biasing the gate of the first transistor, wherein the digit line is biased to the first voltage based at least in part on discharging the multi-level memory cell onto the digit line and means for coupling the digit line with the first transistor after discharging the multi-level memory cell to the digit line. In some examples, the apparatus may support means for writing the determined logic state to the multi-level memory cell after the read operation.

An apparatus is described. In some examples, the apparatus may include a memory cell coupled with a digit line and configured to store three or more states, a first sense component coupled with a node and configured to sense a signal caused by transferring charge between the digit line and the node, a second sense component coupled with the node and configured to sense the signal caused by transferring the charge between the digit line and the node, a first transistor coupled with the digit line and the node of the first sense component and the second sense component, the first transistor configured to transfer the charge between the digit line and the node during a read operation, and a second transistor coupled with a gate of the first transistor and the node of the first sense component and the second sense component, the second transistor configured to apply a first voltage to the gate of the first transistor that compensates for a threshold voltage associated with the first transistor.

In some examples, the first sense component may be configured to compare the signal with a first reference value at a first time of the read operation, and wherein the second sense component is configured to compare the signal with the first reference value at a second time of the read operation. In some examples, the first sense component may be configured to compare the signal with a first reference value at a time of the read operation, and wherein the second sense component is configured to compare the signal with a second reference value at the time of the read operation. In some examples, the apparatus may include a third sense component coupled with the node and configured to sense the signal.

In some examples, the apparatus may include a third transistor coupled with the node and the first sense component, the third transistor configured to isolate the first sense component from the second sense component during at least a portion of the read operation. In some examples, the first transistor may be configured to transfer the charge based at least in part on a second voltage on the digit line being less than the first voltage on the gate of the first transistor during the read operation. In some examples, the apparatus may include a write-back component coupled with at least the first sense component and the second sense component, the write-back component configured to write a value to the memory cell based at least in part on the first sense component sensing the signal and the second sense component sensing the signal.

In some examples, the write-back component may be configured to write at least four logic states to the memory cell. In some examples, the apparatus may include a voltage source coupled with a second node of the first transistor and configured to apply a third voltage to the second node of the first transistor that compensates for the threshold voltage associated with the first transistor, wherein the voltage source applies the third voltage concurrent with the memory cell discharging to the digit line.

An apparatus is described. In some examples, the apparatus may include a multi-level memory cell coupled with a digit line, a first sense component coupled with a node, a second sense component coupled with the node, a first transistor coupled with the node, a second transistor coupled with a gate of the first transistor and the node of the first sense component and the second sense component, and a controller coupled with the multi-level memory cell. In some examples, the controller may be operable to transfer, using the first transistor, a charge between the digit line and the node, sense, by the first sense component, a signal on the node at a first time based at least in part on transferring the charge between the digit line and the node, sense, by the second sense component, the signal on the node at a second time different than the first time based at least in part on transferring the charge between the digit line and the node, and determine a logic state of the multi-level memory cell based at least in part on sensing the signal by the first sense component and sensing the signal by the second sense component.

In some examples, the apparatus may include a third sense component coupled with the node and the controller may be operable to sense, by the third sense component, the signal on the node at a third time different than the second time based at least in part on transferring the charge between the digit line and the node. In some examples, the apparatus may include a third transistor coupled with the node and the controller may be operable to activate the third transistor before sensing the signal by the second sense component. In some examples, the first sense component and the second sense component may be configured to compare the signal on the node with a single fixed reference value.

An apparatus is described. In some examples, the apparatus may include a multi-level memory cell coupled with a digit line, a first sense component coupled with a node, a second sense component coupled with the node, a first transistor coupled with the node, a second transistor coupled with a gate of the first transistor and the node of the first sense component and the second sense component, and a controller coupled with the multi-level memory cell.

In some examples, the controller may be operable to transfer, by the first transistor, a charge between the digit line and the node, sense, by the first sense component, a signal on the node at a time using a first reference value based at least in part on transferring the charge between the digit line and the node, sense, by the second sense component, the signal on the node at the time using a second reference value based at least in part on transferring the charge between the digit line and the node, and determine a logic state of the multi-level memory cell based at least in part on sensing the signal by the first sense component and sensing the signal by the second sense component.

In some examples, the apparatus may include a third sense component coupled with the node and the controller may be operable to sense, by the third sense component, the signal on the node at the time using a third reference value based at least in part on transferring the charge between the digit line and the node. In some examples, the apparatus may include a third transistor coupled with the node and the first sense component and the controller may be operable to activate the third transistor before sensing the signal by the first sense component.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
transferring, using a first transistor, a charge between a digit line and a node of a first sense component and a second sense component during a read operation, wherein the charge is transferred based at least in part on a first voltage on the digit line being less than a second voltage on a gate of the first transistor;
sensing, by the first sense component and via a second transistor coupled between the node and the first sense component, a signal on the node at a time using a first reference value based at least in part on transferring the charge between the digit line and the node;
sensing, by the second sense component and via a third transistor coupled between the node and the second sense component, the signal on the node at the time using a second reference value based at least in part on transferring the charge between the digit line and the node; and
determining a logic state of a multi-level memory cell coupled with the digit line based at least in part on sensing the signal by the first sense component and sensing the signal by the second sense component.

2. The method of claim 1, further comprising:
sensing, by a third sense component coupled with the digit line using the first transistor and via a fourth transistor coupled between the node and the third sense component, the signal on the node at the time using a third reference value based at least in part on transferring the charge between the digit line and the node, wherein determining the logic state of the multi-level memory cell is based at least in part on sensing the signal at the third sense component.

3. The method of claim 2, wherein the multi-level memory cell is configured to store a first logic state, a second logic state, a third logic state, or a fourth logic state.

4. The method of claim 1, further comprising:
biasing the gate of the first transistor to the second voltage before transferring the charge between the digit line and the node; and
discharging the multi-level memory cell onto the digit line based at least in part on applying the second voltage to the gate of the first transistor, wherein the digit line is biased to the first voltage based at least in part on discharging the multi-level memory cell onto the digit line.

5. The method of claim 4, further comprising:
isolating, via a fifth transistor coupled between the digit line and the first transistor, the digit line from the first transistor after biasing the gate of the first transistor to the second voltage; and
coupling the digit line with the first transistor after discharging the multi-level memory cell onto the digit line.

6. The method of claim 1, further comprising:
determining the second voltage on the gate of the first transistor; and
applying, via a sixth transistor coupled between a voltage source and a second node of the first transistor, a third voltage from the voltage source to the second node of the first transistor based at least in part on determining the second voltage on the gate.

7. The method of claim 6, further comprising:
discharging the multi-level memory cell to the digit line concurrent with biasing the gate of the first transistor, wherein the digit line is biased to the first voltage based at least in part on discharging the multi-level memory cell onto the digit line; and
coupling the digit line with the first transistor after discharging the multi-level memory cell to the digit line.

8. The method of claim 1, further comprising:
writing the determined logic state to the multi-level memory cell after the read operation.

9. The method of claim 1, further comprising:
activating the second transistor before sensing the signal by the first sense component.

10. An apparatus, comprising:
a multi-level memory cell coupled with a digit line;
a first sense component coupled with a node;
a second sense component coupled with the node;
a first transistor coupled with the node;
a second transistor coupled with a gate of the first transistor and the node of the first sense component and the second sense component; and
a controller coupled with the multi-level memory cell, the controller configurable to:
transfer, by the first transistor, a charge between the digit line and the node;
sense, by the first sense component and via a third transistor coupled between the node and the first sense component, a signal on the node at a time using a first reference value based at least in part on transferring the charge between the digit line and the node;
sense, by the second sense component and via a fourth transistor coupled between the node and the second sense component, the signal on the node at the time using a second reference value based at least in part on transferring the charge between the digit line and the node; and
determine a logic state of the multi-level memory cell based at least in part on sensing the signal by the first sense component and sensing the signal by the second sense component.

11. The apparatus of claim 10, further comprising:
a third sense component coupled with the node, wherein the controller is configurable to:
sense, by the third sense component and via a fifth transistor coupled between the node and the third sense component, the signal on the node at the time using a third reference value based at least in part on transferring the charge between the digit line and the node.

12. The apparatus of claim 11, wherein the multi-level memory cell is configured to store a first logic state, a second logic state, a third logic state, or a fourth logic state.

13. The apparatus of claim 10, wherein the controller is configurable to:
activate the third transistor before sensing the signal by the first sense component.

14. The apparatus of claim 10, wherein the charge is transferred based at least in part on a first voltage on the digit line being less than a second voltage on the gate of the first transistor and wherein the controller is configurable to:
bias the gate of the first transistor to the second voltage before transferring the charge between the digit line and the node; and
discharge the multi-level memory cell onto the digit line based at least in part on applying the second voltage to the gate of the first transistor, wherein the digit line is biased to the first voltage based at least in part on discharging the multi-level memory cell onto the digit line.

15. The apparatus of claim 14, wherein the controller is configurable to:
isolate, via a sixth transistor coupled between the digit line and the first transistor, the digit line from the first transistor after biasing the gate of the first transistor to the second voltage; and
couple the digit line with the first transistor after discharging the multi-level memory cell onto the digit line.

16. The apparatus of claim 10, wherein the charge is transferred based at least in part on a first voltage on the digit line being less than a second voltage on the gate of the first transistor and wherein the controller is configurable to:
determine the second voltage on the gate of the first transistor; and
apply, via a seventh transistor coupled between a voltage source and a second node of the first transistor, a third voltage from the voltage source to the second node of the first transistor based at least in part on determining the second voltage on the gate.

17. The apparatus of claim 16, wherein the controller is configurable to:
discharge the multi-level memory cell to the digit line concurrent with biasing the gate of the first transistor, wherein the digit line is biased to the first voltage based at least in part on discharging the multi-level memory cell onto the digit line; and
couple the digit line with the first transistor after discharging the multi-level memory cell to the digit line.

18. The apparatus of claim 10, wherein the controller is configurable to:
write the determined logic state to the multi-level memory cell after a read operation.

19. A method, comprising:
transferring, using a first transistor, a charge between a digit line and a node of a first sense component and a second sense component during a read operation, wherein the charge is transferred based at least in part on a first voltage on the digit line being less than a second voltage on a gate of the first transistor;
sensing, by the first sense component and via a second transistor coupled between the node and the first sense component, a signal on the node at a time using a first reference value based at least in part on transferring the charge between the digit line and the node;
sensing, by the second sense component and via a third transistor coupled between the node and the first sense component, the signal on the node at the time using a second reference value based at least in part on transferring the charge between the digit line and the node;
sensing, by a third sense component coupled with the digit line using the first transistor and via a fourth transistor coupled between the node and the third sense component, the signal on the node at the time using a third reference value based at least in part on transferring the charge between the digit line and the node; and
determining a logic state of a multi-level memory cell coupled with the digit line based at least in part on sensing the signal by the first sense component, sensing the signal by the second sense component, and sensing the signal by the third sense component.

20. The method of claim 19, wherein the multi-level memory cell is configured to store a first logic state, a second logic state, a third logic state, or a fourth logic state.

* * * * *